United States Patent
Meier et al.

(10) Patent No.: US 11,195,725 B2
(45) Date of Patent: Dec. 7, 2021

(54) DRY ETCH PROCESS LANDING ON METAL OXIDE ETCH STOP LAYER OVER METAL LAYER AND STRUCTURE FORMED THEREBY

(71) Applicant: Texas Instruments Incorporated, Dallas, TX (US)

(72) Inventors: Sebastian Meier, Munich (DE); Michael Hans Enzelberger-Heim, Munich (DE); Reiner Port, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/897,357

(22) Filed: Jun. 10, 2020

(65) Prior Publication Data

US 2020/0303202 A1   Sep. 24, 2020

Related U.S. Application Data

(62) Division of application No. 15/936,434, filed on Mar. 27, 2018, now Pat. No. 10,707,089.

(51) Int. Cl.
*H01L 21/311* (2006.01)
*H01L 21/02* (2006.01)
(Continued)

(52) U.S. Cl.
CPC .... *H01L 21/31116* (2013.01); *G01N 27/4146* (2013.01); *H01L 21/0228* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/32051* (2013.01); *H01L 24/03* (2013.01); *H01L 24/05* (2013.01);
(Continued)

(58) Field of Classification Search
CPC ......... H01L 24/85; H01L 24/05; H01L 24/03; H01L 21/3065; H01L 21/31116; H01L 21/32137
See application file for complete search history.

(56) References Cited

U.S. PATENT DOCUMENTS 6,297,162 B1 * 10/2001 Jang ............... H01L 21/3145 438/706
6,355,576 B1 * 3/2002 Haley ............ H01L 21/02071 257/E21.252
(Continued)

*Primary Examiner* — Nicholas J Tobergte
(74) *Attorney, Agent, or Firm* — Jacqueline J. Garner; Charles A. Brill; Frank D. Cimino

(57) ABSTRACT

A microelectronic device includes a metal layer on a first dielectric layer. An etch stop layer is disposed over the metal layer and on the dielectric layer directly adjacent to the metal layer. The etch stop layer includes a metal oxide, and is less than 10 nanometers thick. A second dielectric layer is disposed over the etch stop layer. The second dielectric layer is removed from an etched region which extends down to the etch stop layer. The etched region extends at least partially over the metal layer. In one version of the microelectronic device, the etch stop layer may extend over the metal layer in the etched region. In another version, the etch stop layer may be removed in the etched region. The microelectronic device is formed by etching the second dielectric layer using a plasma etch process, stopping on the etch stop layer.

20 Claims, 13 Drawing Sheets

(51) Int. Cl.
  *H01L 21/3205* (2006.01)
  *H01L 23/00* (2006.01)
  *G01N 27/414* (2006.01)

(52) U.S. Cl.
  CPC .... *H01L 24/45* (2013.01); *H01L 2224/02206* (2013.01); *H01L 2224/02215* (2013.01); *H01L 2224/03019* (2013.01); *H01L 2224/0381* (2013.01); *H01L 2224/03614* (2013.01); *H01L 2224/04042* (2013.01); *H01L 2224/05025* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05169* (2013.01); *H01L 2224/05173* (2013.01); *H01L 2224/05176* (2013.01); *H01L 2224/05178* (2013.01); *H01L 2224/05183* (2013.01); *H01L 2224/4502* (2013.01); *H01L 2924/0534* (2013.01); *H01L 2924/0535* (2013.01); *H01L 2924/05341* (2013.01); *H01L 2924/05342* (2013.01); *H01L 2924/05432* (2013.01); *H01L 2924/1207* (2013.01); *H01L 2924/13073* (2013.01)

(56) References Cited

U.S. PATENT DOCUMENTS

| | | | |
|---|---|---|---|
| 6,560,862 B1* | 5/2003 | Chen | H01L 23/5226 |
| | | | 29/843 |
| 6,589,886 B2 | 7/2003 | Kim et al. | |
| 7,425,512 B2 | 9/2008 | Udayakumar et al. | |
| 7,741,222 B2 | 6/2010 | You et al. | |
| 8,043,956 B2* | 10/2011 | Lehr | H01L 24/85 |
| | | | 438/617 |
| 9,013,022 B2* | 4/2015 | Lin | H01L 27/14643 |
| | | | 257/459 |
| 9,236,383 B2 | 1/2016 | Manning | |
| 9,478,652 B1 | 10/2016 | Williams | |
| 9,515,021 B1* | 12/2016 | Chen | H01L 21/76802 |
| 9,577,067 B2* | 2/2017 | Ho | H01L 29/4966 |
| 9,659,811 B1* | 5/2017 | Peng | H01L 21/76811 |
| 9,859,153 B1 | 1/2018 | Rainville et al. | |
| 10,103,099 B2* | 10/2018 | Chi | H01L 21/76868 |
| 2009/0243105 A1* | 10/2009 | Lehr | H01L 24/48 |
| | | | 257/751 |
| 2009/0243123 A1 | 10/2009 | Meisner et al. | |
| 2015/0092371 A1 | 4/2015 | Meinhold | |
| 2015/0137113 A1 | 5/2015 | Yu et al. | |
| 2016/0016791 A1 | 1/2016 | Jacobs | |
| 2017/0103914 A1 | 4/2017 | Damjanovic et al. | |

* cited by examiner

DRY ETCH PROCESS LANDING ON METAL OXIDE ETCH STOP LAYER OVER METAL LAYER AND STRUCTURE FORMED THEREBY

CROSS REFERENCE TO RELATED APPLICATIONS

This application is a divisional of U.S. Nonprovisional patent Ser. No. 15/936,434, filed Mar. 27, 2018, the contents of which is herein incorporated by reference in its entirety.

FIELD OF THE INVENTION

This invention relates to the field of microelectronic devices. More particularly, this invention relates to metal layers in integrated circuits.

BACKGROUND OF THE INVENTION

Microelectronic devices frequently include metal layers of platinum, gold, or such. The metal layers may be used in sensors, such as a thermistor, an ion sensitive field effect transistors (ISFET), and the like. Fabrication of the microelectronic devices frequently requires etching through an overlying dielectric layer containing silicon dioxide, silicon nitride, or such, to expose the metal layer. Etching silicon dioxide and silicon nitride, and subsequently stopping on the metal layer is challenging. Wet etch processes lack lateral dimensional control due to undercutting of the etch mask. Dry etching, such as reactive ion etching (ME), tends to remove a portion of the metal layer and redeposit the metal on sidewalls of the overlying dielectric layer and etch mask, complicating removal of the etch mask and possibly contaminating the etch equipment. Moreover, adhesion of the dielectric layer to metals such as platinum and gold is often unreliable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device includes a first dielectric layer, and a metal layer on the first dielectric layer. An etch stop layer is disposed over the metal layer and the first dielectric layer directly adjacent to the metal layer. The etch stop layer includes a metal oxide, and is less than 10 nanometers thick. A second dielectric layer is disposed over the etch stop layer. The second dielectric layer is removed from an etched region which extends at least partially over the metal layer. In one aspect, the etch stop layer may extend over the metal layer in the etched region. In another aspect, the etch stop layer may be removed in the etched region. The microelectronic device is formed by etching the second dielectric layer using a plasma etch process, stopping on the etch stop layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A microelectronic device includes a first dielectric layer, and a metal layer on the first dielectric layer. An etch stop layer is disposed over the metal layer and the dielectric layer directly adjacent to the metal layer. The etch stop layer includes a metal oxide, and is less than 10 nanometers thick. A second dielectric layer is disposed over the etch stop layer. The second dielectric layer is removed from an etched region which extends from a top surface of the second dielectric layer to a top surface of the etch stop layer, and extends laterally at least partially over the metal layer. In one aspect, the etch stop layer may extend over the metal layer in the etched region. In another aspect, the etch stop layer may be removed in the etched region. The microelectronic device is formed by etching the second dielectric layer using a plasma etch process, stopping on the etch stop layer.

For the purposes of this disclosure, the term "lateral" is understood to refer to a direction parallel to a plane of a top surface of the microelectronic device. Terms such as top, over, above, upward, under, and below may be used in this disclosure. These terms should not be construed as limiting the position or orientation of a structure or element, but should be used to provide spatial relationship between structures or elements.

For the purposes of this disclosure, it will be understood that, if an element is referred to as being adjacent to another element, it may be directly adjacent to the other element, or intervening elements may be present. If an element is referred to as being directly adjacent to another element, it is understood there are no other intentionally disposed intervening elements present.

Figure 1:
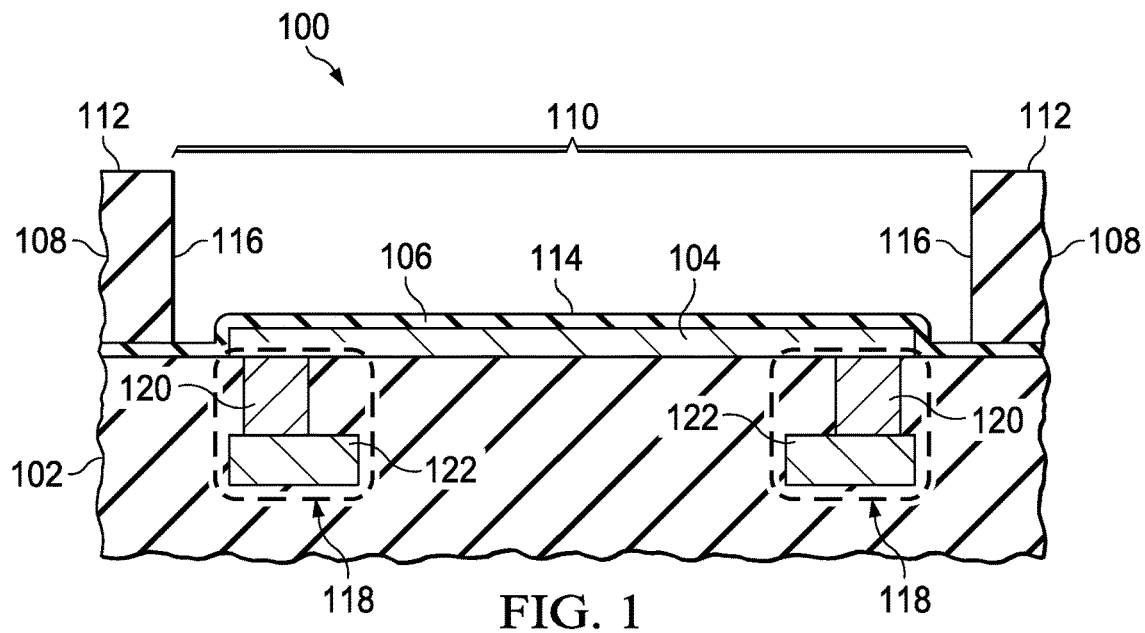
FIG. 1 is a cross section of an example microelectronic device including a metal layer.

FIG. 1 is a cross section of an example microelectronic device including a metal layer. The microelectronic device 100 includes a first dielectric layer 102. The first dielectric layer 102 may include, for example, silicon dioxide, organosilicate glass (OSG), phosphosilicate glass (PSG), borophosphosilicate glass (BPSG), silicon oxynitride, silicon nitride, silicon carbon oxynitride, glass, or sapphire. The first dielectric layer 102 may be a layer of thermally grown silicon dioxide over a silicon substrate.

A metal layer 104 is disposed on the first dielectric layer 102. The metal layer 104 may include, for example, platinum, gold, iridium, silver, palladium, rhodium, ruthenium, rhenium nickel, copper, or a combination thereof. Other metals in the metal layer 104 are within the scope of the instant example. The metal layer 104 may have a thickness of, for example, 10 nanometers to 1 micron. In the instant example, the metal layer 104 may be disposed on a planar surface of the first dielectric layer 102, as depicted in FIG. 1.

An etch stop layer 106 is disposed over the metal layer 104 and over the first dielectric layer 102 directly adjacent to the metal layer 104. The etch stop layer 106 may optionally extend completely across the first dielectric layer 102. The etch stop layer 106 is less than 10 nanometers thick. The etch stop layer 106 includes at least one metal oxide, such as aluminum oxide, titanium oxide, zirconium oxide, hafnium oxide, vanadium oxide or tantalum oxide. The etch stop layer 106 has a composition different from a composition of the first dielectric layer 102.

A second dielectric layer 108 is disposed over the etch stop layer 106. The second dielectric layer 108 may include, for example, silicon dioxide, silicon nitride, or silicon oxynitride. The second dielectric layer 108 has a composition different from a composition of the etch stop layer 106. The second dielectric layer 108 has a thickness of at least 100 nanometers, in order to adequately protect the microelectronic device 100 from contamination or mechanical damage.

The microelectronic device 100 is free of the second dielectric layer 108 in an etched region 110. The etched region 110 extends upward from a top surface 114 of the etch stop layer 106 to a top surface 112 of the second dielectric layer 108, and extends laterally over at least a portion of the metal layer 104. In the instant example, the etched region 110 may extend over the entire metal layer 104, as depicted in FIG. 1. The etch stop layer 106 may optionally be present in the etched region 110 and extend across the etched region 110, as depicted in FIG. 1. Alternatively, a portion or all of the etched region 110 may be free of the etch stop layer 106. Lateral surfaces 116 of the second dielectric layer 108 facing the etched region 110 may be straight, which is not readily attained by a wet etch process, and is indicative of the etched region 110 being formed by a plasma process. Wet etch processes commonly produce curved lateral surfaces. The lateral surfaces 116 of the second dielectric layer 108 facing the etched region 110 may be substantially vertical, as depicted in FIG. 1, or may be angled from the vertical, for example by up to 20 degrees.

The metal layer 104 of the instant example may be contacted by one or more electrical connections 118. In the instant example, the electrical connections 118 may be located in the first dielectric layer 102. The electrical connections 118 of the instant example may include, for example, vias 120 and interconnects 122. Other configurations for the electrical connections 118, optionally with other components, are within the scope of the instant example.

The metal layer 104 may provide a sensing element for a sensor such as a thermistor. Having the etched region 110 free of the second dielectric layer 108 may advantageously enable physical coupling between the metal layer 104 and an environment contacting the microelectronic device 100. The etch stop layer 106 may reduce loss of the metal layer 104 during operation of the microelectronic device 100 in some environments, such as in an oxidizing ambient or at a high temperature of above 100° C. Having the thickness of the etch stop layer 106 less than 10 nanometers may advantageously provide a desired level of physical coupling between the metal layer 104 and the environment.

Figure 2A:
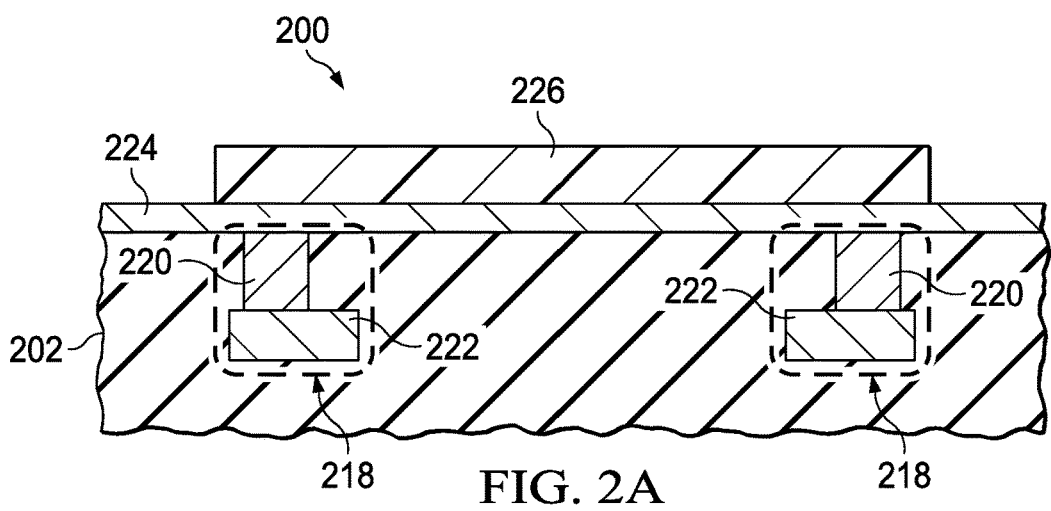
FIG. 2A through FIG. 2H are cross sections of a microelectronic device which includes a metal layer, depicted in stages of an example method of formation.

FIG. 2A through FIG. 2H are cross sections of a microelectronic device which includes a metal layer, depicted in stages of an example method of formation. Referring to FIG. 2A, the microelectronic device 200 includes a first dielectric layer 202, which may have a composition as disclosed in reference to the first dielectric layer 102 of FIG. 1. The first dielectric layer 202 may be formed, for example, by a plasma enhanced chemical vapor deposition (PECVD) process, a low pressure chemical vapor deposition (LPCVD) process, a spin-on process using hydrogen silsesquioxane (HSQ), or a thermal oxidation process for cases in which the first dielectric layer 202 is formed on a silicon substrate.

The microelectronic device 200 may include electrical connections 218 in or through the first dielectric layer 202. The electrical connections 218 may include vias 220 extending to a surface of the first dielectric layer 202, and interconnects 222 contacting the vias 220.

A metal film 224 is formed on the first dielectric layer 202. The metal film 224 may include one or more of the metals disclosed in reference to the metal layer 104 of FIG. 1. The metal film 224 may be formed, for example, by an evaporation process, a sputter process, or a metalorganic chemical vapor deposition (MOCVD) process. The metal film 224 may have a thickness of 10 nanometers to 1 micron, for example. The metal film 224 may contact the electrical connections 218, so that electrical signals may be sent through the metal film 224 using the electrical connections 218.

A first etch mask 226 is formed over the metal film 224 to cover an area for a subsequently formed metal layer. The first etch mask 226 may include photoresist and an anti-reflection layer, for example. The first etch mask 226 may be formed by a photolithographic process. Other methods of forming the first etch mask 226, such as an additive process, are within the scope of the instant example.

Figure 2B:
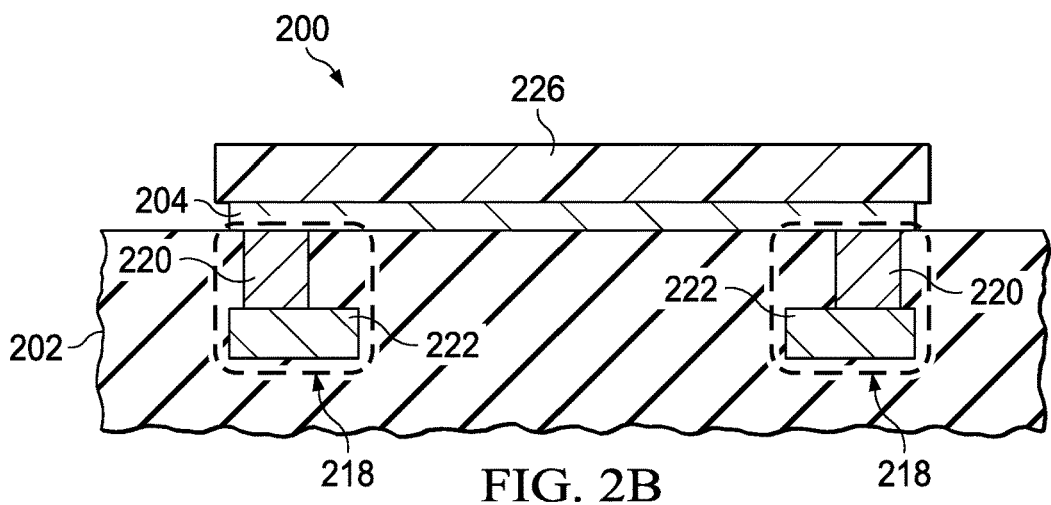

Referring to FIG. 2B, the metal film 224 of FIG. 2A is removed where exposed by the first etch mask 226 to form the metal layer 204. The metal film 224 may be removed by a wet etch process, for example. The metal layer 204 may be recessed from lateral edges of the first etch mask 226 as a result of undercutting by the wet etch process. Other methods of removing the metal film 224, such as a plasma process, are within the scope of the instant example.

The first etch mask 226 is subsequently removed. Photoresist and organic anti-reflection material in the first etch mask 226 may be removed by an asher process followed by a wet clean process, for example.

Figure 2C:
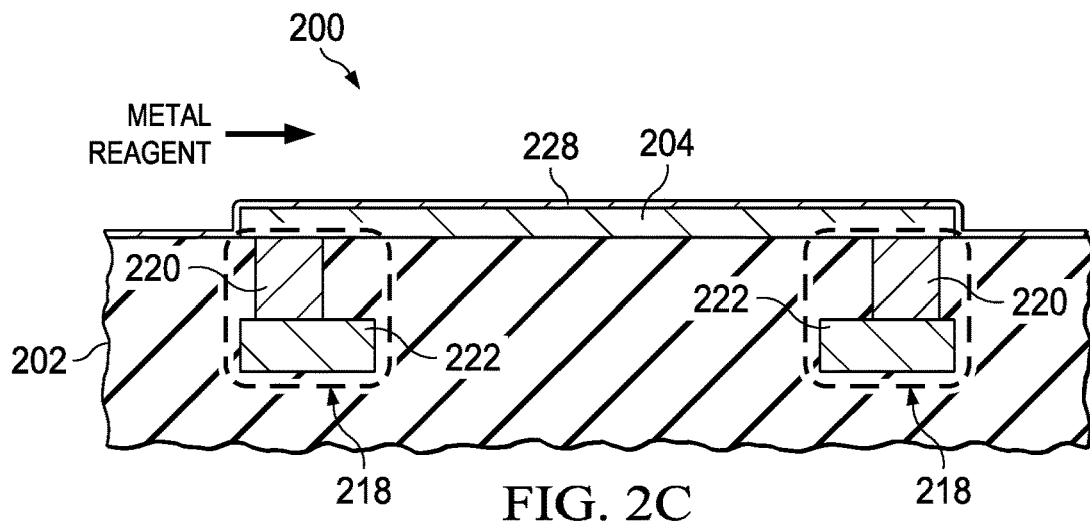
Figure 2D:
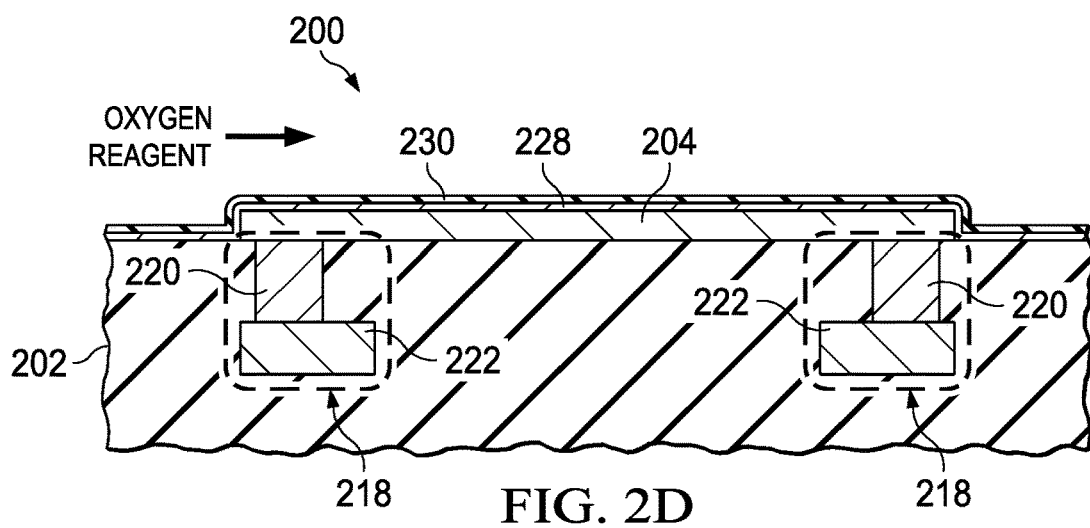
Figure 2E:
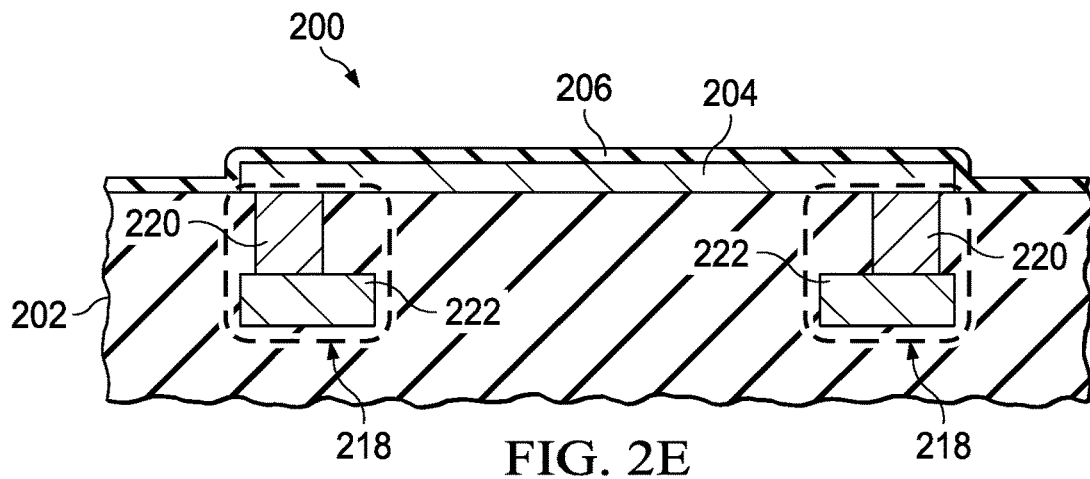

Referring to FIG. 2C, the microelectronic device 200 is exposed to a metal-containing reagent, denoted in FIG. 2C as "METAL REAGENT", as part of an atomic layer deposition (ALD) process to form an etch stop layer 206 shown in FIG. 2E. The metal-containing reagent forms a metal-containing layer 228 over the metal layer 204 and over the first dielectric layer 202 directly adjacent to the metal layer 204. The metal-containing layer 228 may extend completely over the first dielectric layer 202. The metal-containing layer 228 may have a thickness of approximately one molecular layer.

The metal-containing reagent may include aluminum, for example, as trimethyl aluminum. The metal-containing reagent may include titanium, for example, as titanium isopropoxide or tetrakis(dimethylamido)titanium. The metal-containing reagent may include tantalum, for example, as tantalum ethoxide. The metal-containing reagent may include zirconium, for example, as tetrakis (dimethylamido)zirconium, tetrakis(ethylmethylamido)zirconium, or tetrakis(diethylamido)zirconium. The metal-containing reagent may include hafnium, for example, as tetrakis(dimethylamido)hafnium, tetrakis(ethylmethylamido)hafnium, or tetrakis(diethylamido)hafnium. The metal-containing reagent may include vanadium, for example, as tetrakis(dimethylamido)vanadium. Other compositions for the metal-containing reagent are within the scope of the instant example.

The microelectronic device 200 may be heated during the ALD process, to provide a desired stoichiometry and density for the etch stop layer 206. Heating the microelectronic device 200 may also provide a desired low hydrogen content in the etch stop layer 206. The microelectronic device 200 may be heated, for example, to 50° C. to 300° C.

After the metal-containing layer 228 is formed, flow of the metal-containing reagent is stopped. An ambient over the microelectronic device 200 is purged, for example by another gas, such as argon, to remove any residual metal-containing reagent.

Referring to FIG. 2D, the microelectronic device 200 is exposed to an oxygen-containing reagent, denoted in FIG. 2D as "OXYGEN REAGENT", as part of the ALD process to form the etch stop layer 206 of FIG. 2E. The oxygen-containing reagent forms an oxygen-containing layer 230 on the metal-containing layer 228. The oxygen-containing layer 230 may have a thickness of approximately one molecular layer. The oxygen-containing reagent may include, for example, water vapor, ozone, or atomic oxygen provided by an oxygen plasma.

The oxygen in the oxygen-containing layer 230 reacts with the metal in the metal-containing layer 228 to form a layer of metal oxide of the etch stop layer 206. Organic functional groups in the metal-containing layer 228 desorb from the microelectronic device 200.

Subsequently, flow of the oxygen-containing reagent is stopped. An ambient over the microelectronic device 200 is purged to remove any residual oxygen-containing reagent.

Referring to FIG. 2E, the etch stop layer 206 is formed by sequentially repeating the steps disclosed in reference to FIG. 2C and FIG. 2D, adding layers of metal oxide to the etch stop layer 206. For example, forming aluminum oxide 4 nanometers thick using trimethyl aluminum and ozone may be accomplished by approximately 40 sequential iterations of the disclosed in reference to FIG. 2C and FIG. 2D. The etch stop layer 206 may include any of the metal oxides disclosed in reference to the etch stop layer 106 of FIG. 1.

Figure 2F:
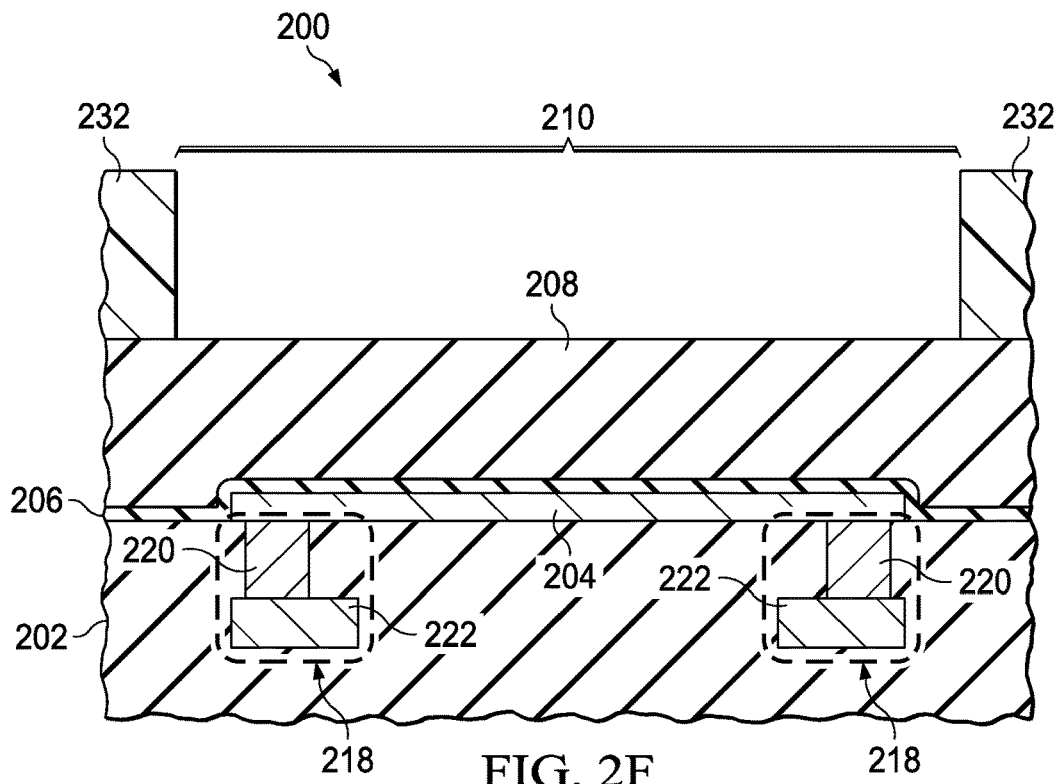

Referring to FIG. 2F, a second dielectric layer 208 is formed over the etch stop layer 206. The second dielectric layer 208 may include a single layer of dielectric material, or two or more sublayers of dielectric material. The second dielectric layer 208 may include silicon dioxide, silicon nitride, silicon oxynitride, or any combination thereof. The second dielectric layer 208 may be at least 100 nanometers thick, to provide desired protection of the microelectronic device 200. The second dielectric layer 208 may be formed, for example, by a PECVD process, an LPCVD process, or a spin-on process. The etch stop layer 206 may advantageously provide better adhesion to the metal layer 204 than would be provided by forming the second dielectric layer 208 directly on the metal layer 204. In versions of the instant example in which the metal layer 204 includes primarily platinum or gold, the metal oxide in the etch stop layer 206 may provide superior adhesion than other dielectric materials.

A second etch mask 232 is formed over the second dielectric layer 208 which exposes an area for an etched region 210. The area for the etched region 210 extends over at least a portion of the metal layer 204. The second etch mask 232 may include photoresist, formed by a photolithographic process, which may advantageously reduce a fabrication cost of the microelectronic device 200 compared to forming an etch mask using hard mask materials such as amorphous carbon.

Figure 2G:
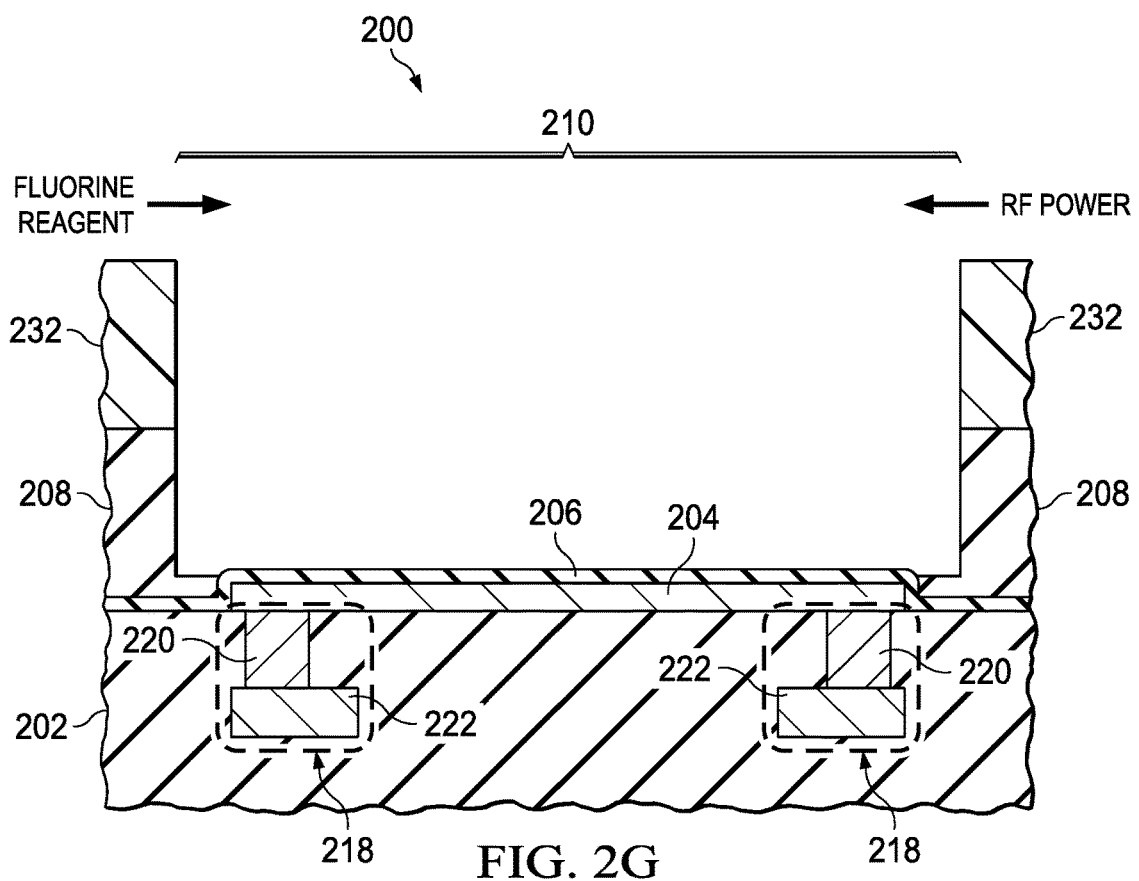

Referring to FIG. 2G, the second dielectric layer 208 is removed from the etched region 210, stopping on the etch stop layer 206, by a plasma process using fluorine. FIG. 2G depicts the plasma process partway to completion. The plasma process flows a fluorine-containing reagent, denoted in FIG. 2G as "FLUORINE REAGENT" over the microelectronic device 200. The fluorine-containing reagent may include one or more fluorine-containing gases, for example, a combination of tetrafluoromethane (CF4) and trifluoromethane (CHF3). A carrier gas such as nitrogen may also be flowed over the microelectronic device 200. Radio frequency (RF) power is applied to the fluorine-containing reagent to form a plasma which provides fluorine radicals, including fluorine ions, to remove the second dielectric layer 208 from the etched region 210. The second dielectric layer 208 is at least 10 times thicker than the etch stop layer 206, so an etch rate of the etch stop layer 206 by the plasma process must be much lower rate than an etch rate of the second dielectric layer 208 by the plasma process. This etch rate condition may be attained by having the plasma process substantially free of gases which tend to provide sputter etch mechanisms, that is, gases such as the noble gases, namely, helium, neon, argon, or xenon. Using fluorine without argon in the plasma process to remove the second dielectric layer 208 has been demonstrated to have a sufficiently low etch rate of an etch stop layer 206 which includes aluminum oxide, as to enable stopping on an implementation of the etch stop layer 206 that is 4 nanometers thick after removing an implementation of the second dielectric layer 208 that is 500 nanometers thick. The term "stopping on the etch stop layer 206" is understood to include removing a first portion of the etch stop layer 206 during the plasma process, so that a second portion of the etch stop layer 206 remains after the plasma process is completed. Elimination of the noble gases from the plasma process may reduce the etch rate of the second dielectric layer 208, thus prolonging the etch time. To reduce degradation of the second etch mask 232, the gases over the microelectronic device 200 may be substantially free of oxygen. In the context of the plasma process to remove the second dielectric layer 208 from the etched region 210, the term "substantially free" is understood to mean that the relevant gas, that is, a noble gas or oxygen, is not purposely introduced into the plasma process.

Figure 2H:
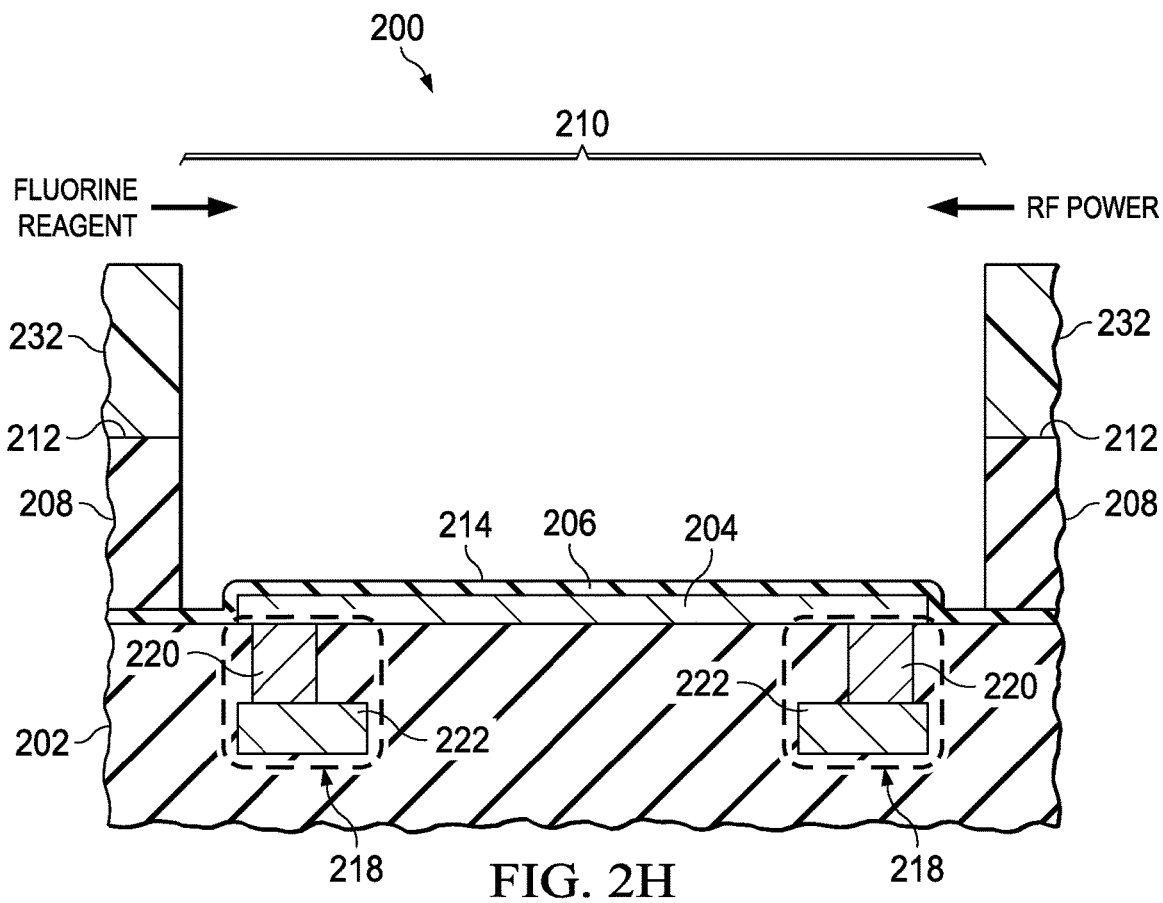

Referring to FIG. 2H, the plasma process used to remove the second dielectric layer 208 from the etched region 210 may be continued after the etch stop layer 206 is exposed throughout the etched region 210, a step commonly referred to as overetch. The overetch step may continue for a time that is half as long as the time needed to remove the second dielectric layer 208 from the etched region 210. At least a portion of the etch stop layer 206 may remain after the overetch step is completed, so that the overetch step may advantageously provide for complete removal of the second dielectric layer 208 across a workpiece, such as a wafer, containing the microelectronic device 200, and may also provide for complete removal of the second dielectric layer 208 from wafer to wafer, in view of variations of thickness of the second dielectric layer 208 between wafers. The etched region 210 extends upward from a top surface 214 of the etch stop layer 206 to a top surface 212 of the second dielectric layer 208.

The second etch mask 232 is subsequently removed, leaving the etch stop layer 206 in place in the etched region 210, to provide a structure similar to that disclosed in reference to FIG. 1. The second etch mask 232 may be removed by an asher process, for example a barrel asher process or a downstream asher process, to reduce ion damage to the etch stop layer 206. Alternatively, a wet photoresist removal process using a commercial photoresist stripper may be used.

Figure 3:
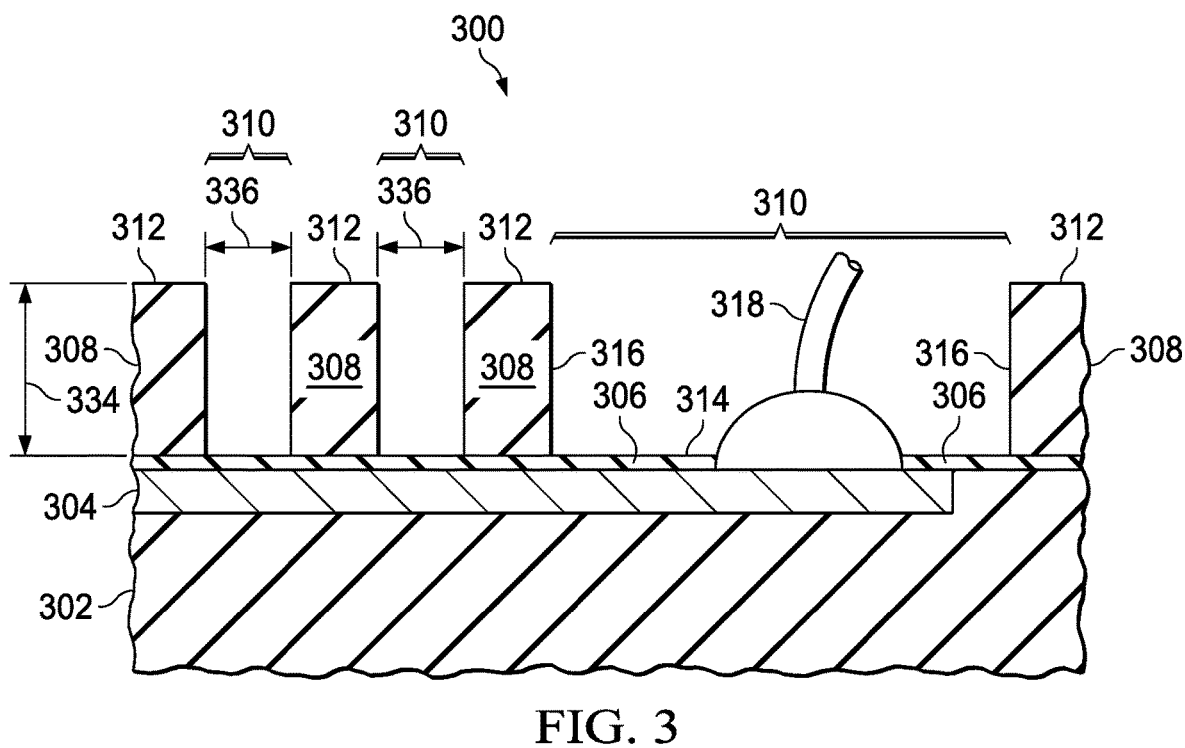
FIG. 3 is a cross section of another example microelectronic device including a metal layer.

FIG. 3 is a cross section of another example microelectronic device including a metal layer. The microelectronic device 300 includes a first dielectric layer 302. The first dielectric layer 302 may include any of the dielectric materials disclosed in reference to the first dielectric layer 102 of FIG. 1. A metal layer 304 is disposed on the first dielectric layer 302. The metal layer 304 may include any of the metals disclosed in reference to the metal layer 104 of FIG. 1. In the instant example, the metal layer 304 is disposed in a trench of the first dielectric layer 302, as depicted in FIG. 3.

An etch stop layer 306 is disposed over the metal layer 304 and over the first dielectric layer 302 directly adjacent to the metal layer 304. The etch stop layer 306 is less than 10 nanometers thick. The etch stop layer 306 includes at least one metal oxide, for example, any of the metal oxides disclosed in reference to the etch stop layer 106 of FIG. 1. The etch stop layer 306 has a composition different from a composition of the first dielectric layer 302.

A second dielectric layer 308 is disposed over the etch stop layer 306. The second dielectric layer 308 may include any of the dielectric materials disclosed in reference to the second dielectric layer 108 of FIG. 1. The second dielectric layer 308 has a composition different from a composition of the etch stop layer 306. The second dielectric layer 308 has a thickness 334 of at least 100 nanometers.

The microelectronic device 300 is free of the second dielectric layer 308 in an etched region 310. The etched region 310 extends upward from a top surface 314 of the etch stop layer 306 to a top surface 312 of the second dielectric layer 308, and extends laterally over at least a portion of the metal layer 304. In the instant example, the etched region 310 may be discontinuous, as indicated in FIG. 3. The etch stop layer 306 may optionally be present in the etched region 310 and extend across the etched region 310, as depicted in FIG. 3. Alternatively, a portion or all of the etched region 310 may be free of the etch stop layer 306. Lateral surfaces 316 of the second dielectric layer 308 facing the etched region 310 may be straight, which is not readily attained by a wet etch process, and is indicative of the etched region 310 being formed by a plasma process. A width 336 of the etched region 310 between two adjacent portions of the second dielectric layer 308 may be less than the thickness 334 of the second dielectric layer 308, which is not readily attained by a wet etch process, and is also indicative of the etched region 310 being formed by a plasma process. Having straight lateral surfaces 316 and widths 336 of the etched region 310 less than the thickness 334 of the second dielectric layer 308 may enable a smaller area for a component with the metal layer 304, advantageously reducing a size and fabrication cost of the microelectronic device 300.

The metal layer 304 of the instant example may be contacted by one or more electrical connections 318. In the instant example, the electrical connections 318 may include a wire bond on the metal layer 304 through the etch stop layer 306. The thickness of the etch stop layer 306 being less than 10 nanometers may advantageously enable forming a reliable wire bond to the metal layer 304 without removing the etch stop layer 306. The etched region 310 and the etch stop layer 306 may provide the advantages disclosed in reference to the microelectronic device 100 of FIG. 1.

Figure 4A:
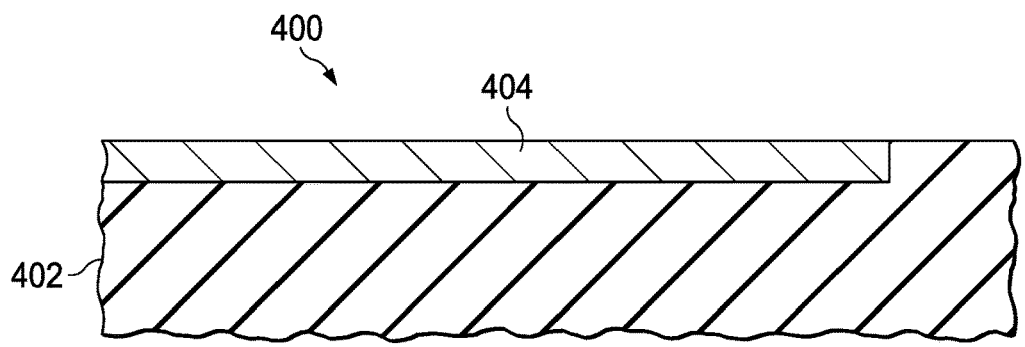
FIG. 4A through FIG. 4E are cross sections of a microelectronic device which includes a metal layer, depicted in stages of another example method of formation.

FIG. 4A through FIG. 4E are cross sections of a microelectronic device which includes a metal layer, depicted in stages of another example method of formation. Referring to FIG. 4A, the microelectronic device 400 includes a first dielectric layer 402, which may have a composition as disclosed in reference to the first dielectric layer 102 of FIG. 1. The first dielectric layer 402 may be formed by any of the processes disclosed in reference to the first dielectric layer 202 of FIG. 2A.

A metal layer 404 is formed on the first dielectric layer 402. In the instant example, the metal layer 404 is formed in a trench in the first dielectric layer 402, as depicted in FIG. 4A. The trench may be formed by an etch process before forming the metal. The metal layer 404 may be formed by forming a metal film on the first dielectric layer 402, extending into the trench. The metal film may be formed by any of the processes disclosed in reference to the metal film 224 of FIG. 2A. Subsequently, the metal film is removed from outside of the trench, for example by a chemical mechanical polish (CMP) process. The metal layer 404 may include any of the metals disclosed in reference to the metal layer 104 of FIG. 1.

Figure 4B:
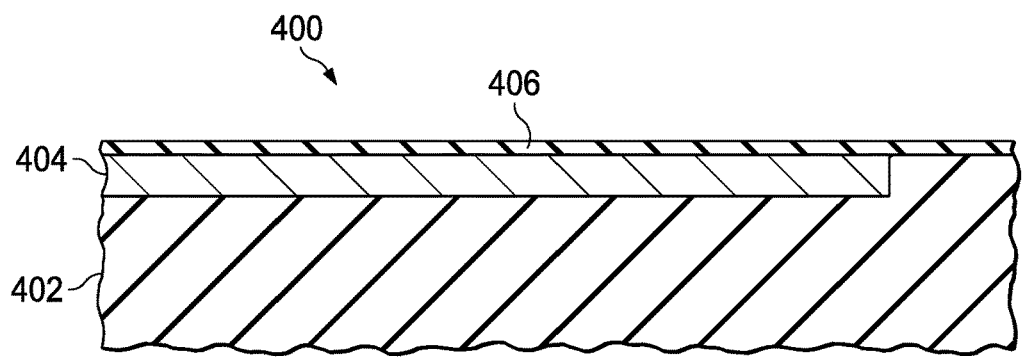

Referring to FIG. 4B, an etch stop layer 406 is formed on the metal layer 404 and on the first dielectric layer 402 directly adjacent to the metal layer 404. The etch stop layer 406 includes metal oxide, and is less than 10 nanometers thick. The etch stop layer may be formed by an ALD process, for example as disclosed in reference to FIG. 2C through FIG. 2E.

Figure 4C:
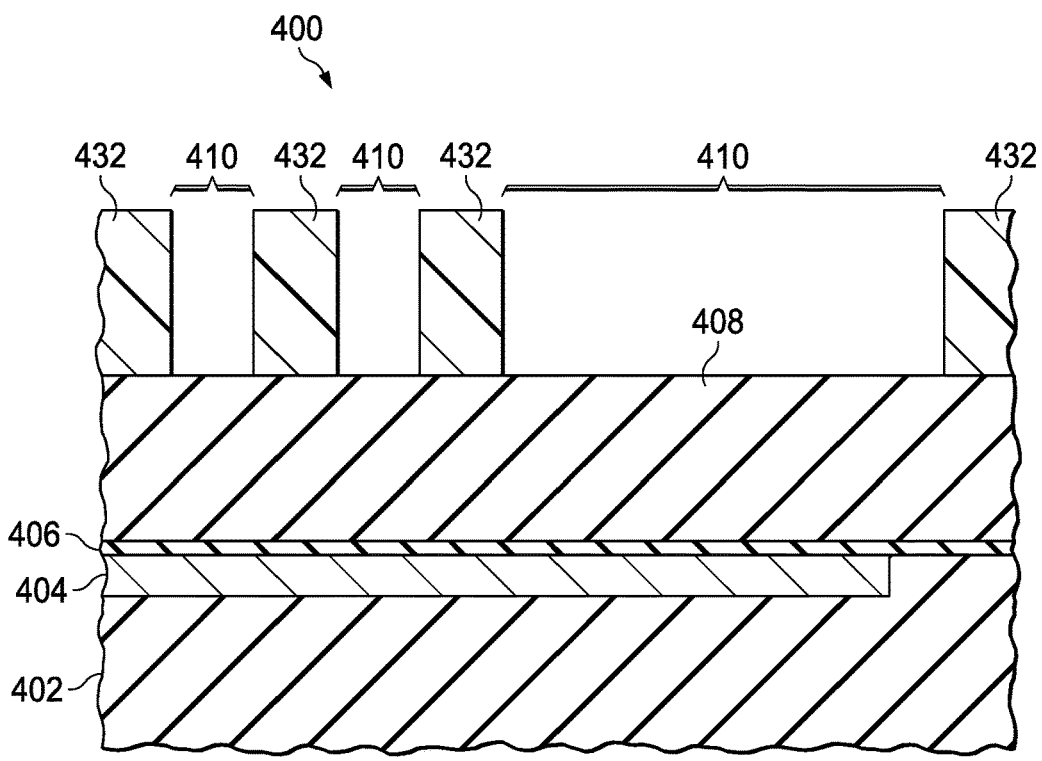

Referring to FIG. 4C, a second dielectric layer 408 is formed over the etch stop layer 406. The second dielectric layer 408 may include any of the dielectric materials and may be formed by any of the processes disclosed in reference to the second dielectric layer 208 of FIG. 2F. The second dielectric layer 408 may be at least 100 nanometers thick.

An etch mask 432 is formed over the second dielectric layer 408 which exposes an area for an etched region 410. The area for the etched region 410 extends over at least a portion of the metal layer 404, and may optionally be discontinuous, as indicated in FIG. 4C. The etch mask 432 may include photoresist, formed by a photolithographic process, accruing the advantage described in reference to the second etch mask 232 of FIG. 2F.

Figure 4D:
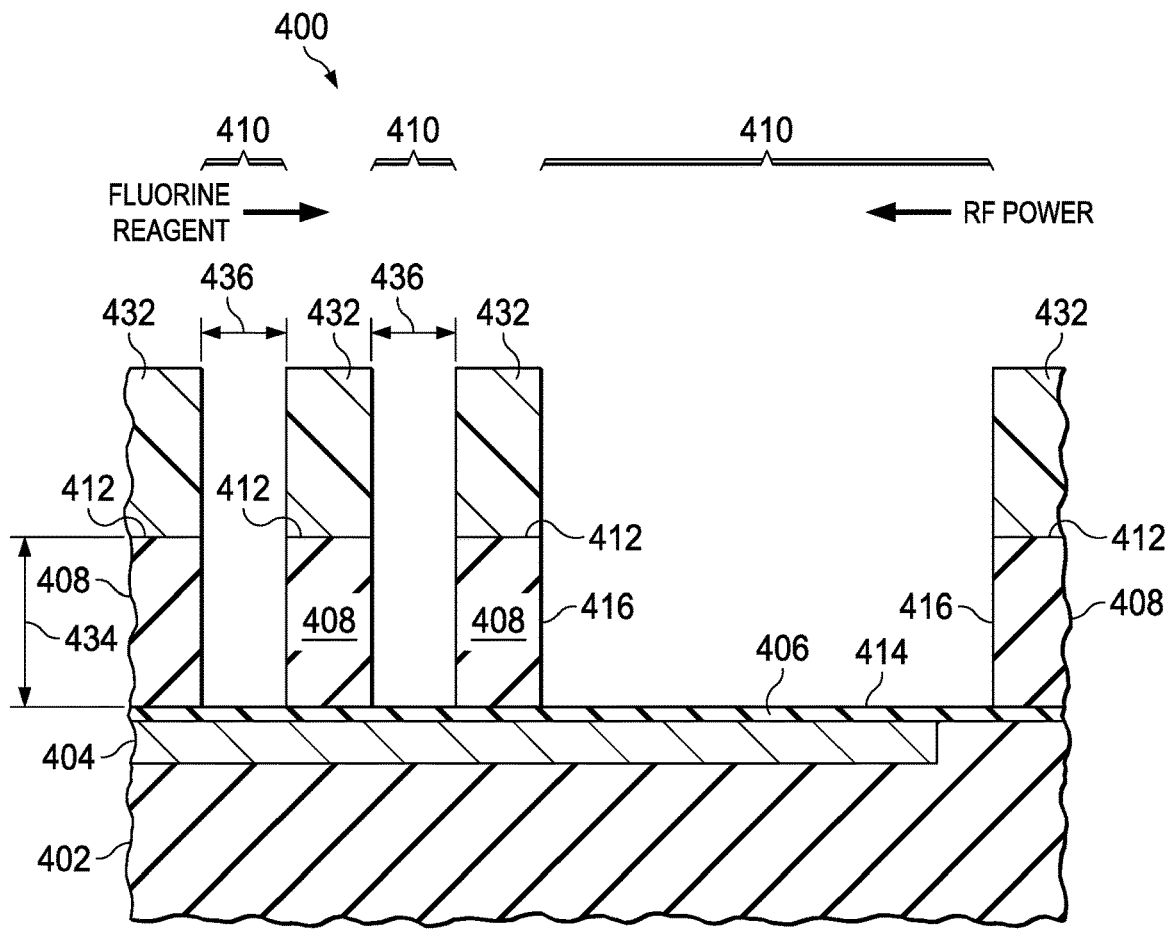

Referring to FIG. 4D, the second dielectric layer 408 is removed from the etched region 410, stopping on the etch stop layer 406, by a plasma process using a fluorine-containing reagent, denoted in FIG. 4D as "FLUORINE REAGENT". A carrier gas may also be used in the plasma process. RF power, denoted in FIG. 4D as "RF POWER", is applied to the fluorine-containing reagent to form a plasma. The plasma process may be substantially free of the noble gases and oxygen, accruing the advantages discussed in reference to FIG. 2G and FIG. 2H. The plasma process may enable forming the etched region 410 with smaller geometries than can be readily attained by a wet etch process, due to undercutting by the wet etch process. The plasma process may produce substantially straight profiles of lateral surfaces 416 of the second dielectric layer 408. Furthermore, a width 436 of the etched region 410 between two adjacent portions of the second dielectric layer 408 may be less than a thickness 434 of the second dielectric layer 408. The etched region 410 extends upward from a top surface 414 of the etch stop layer 406 to a top surface 412 of the second dielectric layer 408.

The etch mask 432 is subsequently removed. The etch mask 432 may be removed, for example, by a plasma process using oxygen, a wet clean process, or a combination thereof.

Figure 4E:
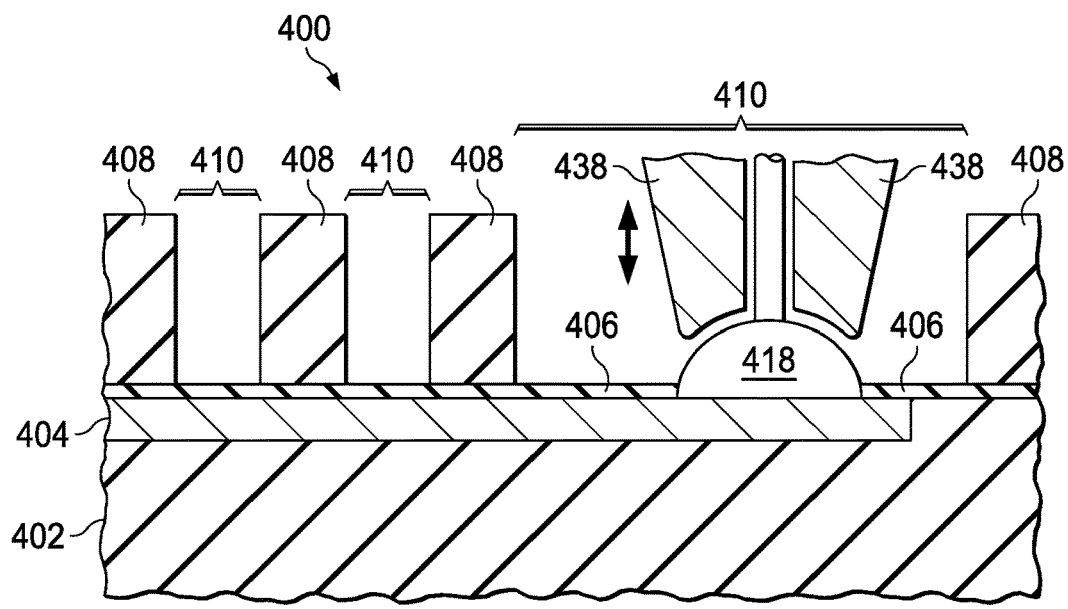

Referring to FIG. 4E, an electrical connection 418, which is implemented in the instant example as a wire bond 418, is formed on the metal layer 404 in the etched region 410, using a wire bonding tool 438. In the instant example, the wire bond 418 may be formed by an ultrasonic bonding process through the etch stop layer 406, advantageously eliminating patterning or removing the etch stop layer 406. The thickness of the etch stop layer 406 being less than 10 nanometers may advantageously enable forming the wire bond 418 to the metal layer 404 having a desired mechanical integrity and reliability.

Figure 5:
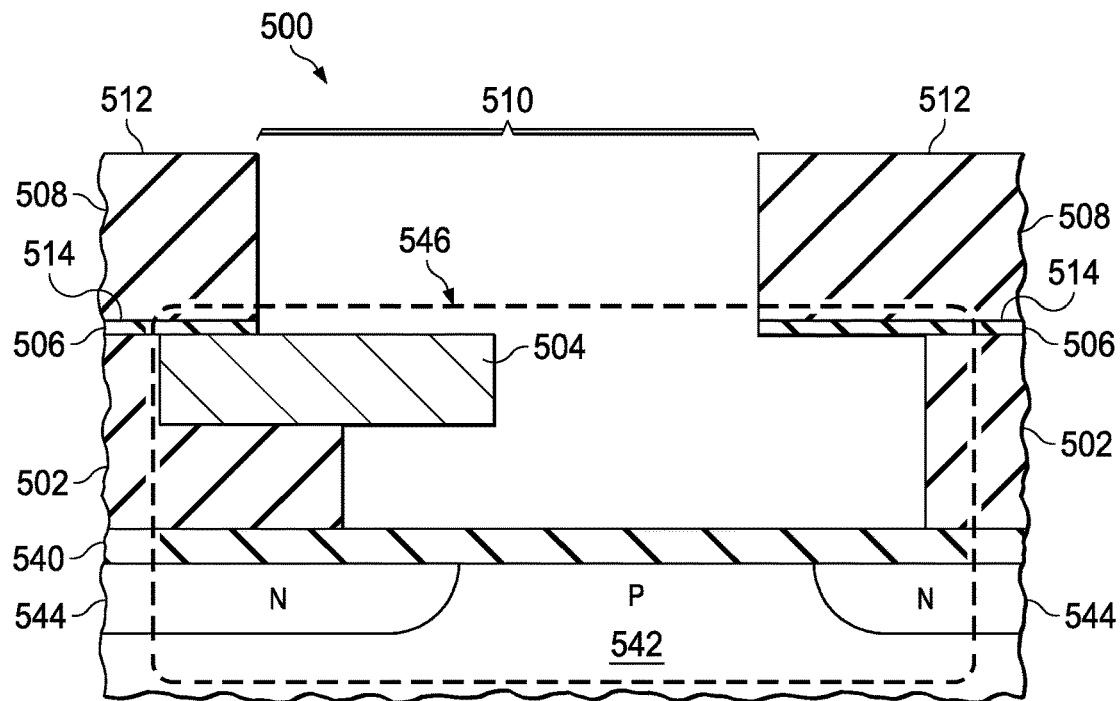
FIG. 5 is a cross section of another example microelectronic device including a metal layer.

FIG. 5 is a cross section of another example microelectronic device including a metal layer. The microelectronic device 500 includes a first dielectric layer 502. The first dielectric layer 502 may include any of the dielectric materials disclosed in reference to the first dielectric layer 102 of FIG. 1. A metal layer 504 is disposed on the first dielectric layer 502. The metal layer 504 may include any of the metals disclosed in reference to the metal layer 104 of FIG. 1. The metal layer 504 may be disposed in a trench in the first dielectric layer 502, as depicted in FIG. 5, or may be disposed on the first dielectric layer 502 in another configuration.

An etch stop layer 506 is disposed partway over the metal layer 504 in the instant example, and over the first dielectric layer 502 directly adjacent to the metal layer 504. The etch stop layer 506 is less than 10 nanometers thick. The etch stop layer 506 includes at least one metal oxide, for example, any of the metal oxides disclosed in reference to the etch stop layer 106 of FIG. 1. The etch stop layer 506 has a composition different from a composition of the first dielectric layer 502.

A second dielectric layer 508 is disposed over the etch stop layer 506. The second dielectric layer 508 may include any of the dielectric materials disclosed in reference to the second dielectric layer 108 of FIG. 1. The second dielectric layer 508 has a composition different from a composition of the etch stop layer 506. The second dielectric layer 508 has a thickness of at least 100 nanometers.

In the instant example, the microelectronic device 500 may include a third dielectric layer 540 below the first dielectric layer 502. The third dielectric layer 540 may have a composition different from a composition of the first dielectric layer 502. For example, the first dielectric layer 502 may include primarily silicon dioxide, and the third dielectric layer 540 may include a sublayer of primarily silicon nitride over a thin sublayer of thermal oxide. The microelectronic device 500 may further include a semiconductor region 542 below the third dielectric layer 540.

The microelectronic device 500 is free of the second dielectric layer 508 in an etched region 510. The etched region 510 of the instant example extends upward from a top surface 514 of the etch stop layer 506 to a top surface 512 of the second dielectric layer 508, and laterally over a portion of the metal layer 504. In the instant example, the etched region 510 may further extend below the etch stop layer 506 to the third dielectric layer 540, so that the microelectronic device 500 is also free of the first dielectric layer 502 in the etched region 510, as indicated in FIG. 5. In the instant example, a portion of the metal layer 504 may be exposed to the etched region 510, as depicted in FIG. 5.

The semiconductor region 542 may have a first conductivity type, for example, p-type, below the etched region 510. The semiconductor region 542 may further include source and drain regions 544 extending partway under the etched region 510. The source and drain regions 544 have an opposite conductivity type from the semiconductor region 542 below the etched region 510. In the case in which the semiconductor region 542 below the etched region 510 is p-type, the source and drain regions 544 may be n-type.

The metal layer 504, the etched region 510, the third dielectric layer 540, the semiconductor region 542 below the etched region 510, and the source and drain regions 544 may provide an ISFET 546 of the microelectronic device 500. During operation of the microelectronic device 500, fluid such as an aqueous solution is admitted into the etched region 510, so that the fluid contacts the metal layer 504 and the third dielectric layer 540. A potential may be provided to the metal layer 504, while current flow is measured between the source and drain regions 544. A relationship between the potential applied to the metal layer 504 and the current flow between the source and drain regions 544 may provide information about the fluid, for example a concentration of ions or a pH value of the fluid. The ISFET 546 may have a small area compared to other ISFET configurations integrated into microelectronic devices, advantageously improving a sensitivity of the ISFET 546, which may be proportional to a ratio of a channel width to a channel length, as well as reducing a size and fabrication cost of the microelectronic device 500. The ISFET 546 may enable the microelectronic device 500 to sample small volumes of the fluid, for example, less than a picoliter of the fluid, compared to other ISFET configurations, advantageously allowing the microelectronic device 500 to be used in a wider variety of applications. STW: thanks for pointing this advantage out.

Figure 6A:
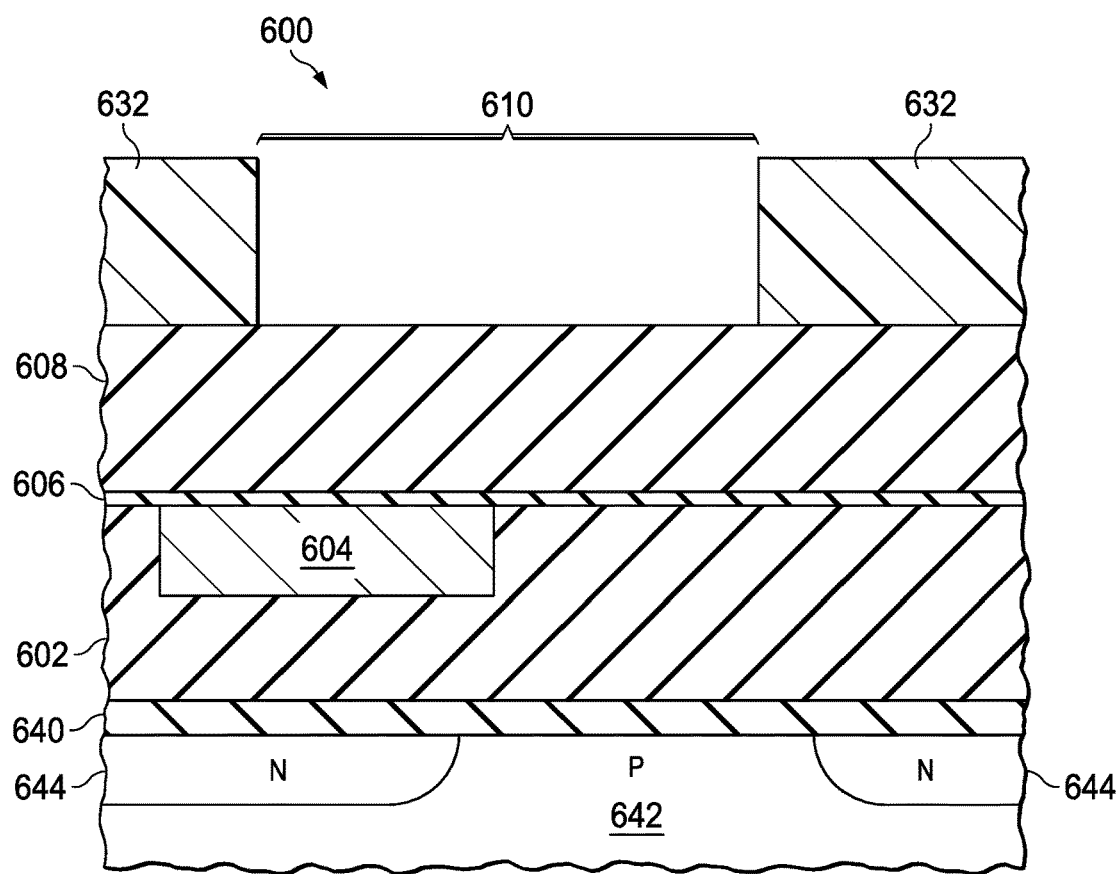
FIG. 6A through FIG. 6D are cross sections of a microelectronic device which includes a metal layer, depicted in stages of a further example method of formation.

FIG. 6A through FIG. 6D are cross sections of a microelectronic device which includes a metal layer, depicted in stages of a further example method of formation. Referring to FIG. 6A, the microelectronic device 600 of the instant example may include a semiconductor region 642 having a first conductivity type. The first conductivity type may be p-type, as indicated in FIG. 6A. Source and drain regions 644 having a second, opposite, conductivity type, may be formed in the semiconductor region 642. The second conductivity type may be n-type, as indicated in FIG. 6A. The source and drain regions 644 may be formed by implanting dopants of the second conductivity type, for example, phosphorus and arsenic, into the semiconductor region 642. The microelectronic device 600 of the instant example may further include a third dielectric layer 640 over the semiconductor region 642. The third dielectric layer 640 may include a thin sublayer of thermal oxide on the semiconductor region 642, and a sublayer of another dielectric material such as silicon nitride on the thin layer of thermal oxide. Thermal oxide in the third dielectric layer 640 may be formed by thermal oxidation of silicon at a top surface of the semiconductor region 642. Silicon nitride in the third dielectric layer 640 may be formed by an LPCVD process. Other compositions, structures, and methods of formation for the third dielectric layer 640 are within the scope of the instant example.

The microelectronic device 600 includes a first dielectric layer 602 over the third dielectric layer 640. The first dielectric layer 602 may have a composition different from a top sublayer of the third dielectric layer 640, to provide a desired selectivity to a subsequent etch process used to remove a portion of the first dielectric layer and stop in or on the third dielectric layer 640. For example, the first dielectric layer 602 may include primarily silicon dioxide or a silicon dioxide-based dielectric material such as OSG. The first dielectric layer 602 may be formed by any of the processes disclosed in reference to the first dielectric layer 202 of FIG. 2A.

A metal layer 604 is formed on the first dielectric layer 602. In the instant example, the metal layer 604 may be formed in a trench in the first dielectric layer 602, as depicted in FIG. 6A. The trench and the metal layer 604 may be formed as described in reference to the metal layer 404 of FIG. 4A. Alternatively, the first dielectric layer 602 may have a planar top surface, and the metal layer 604 may be formed on the planar top surface. The metal layer 604 in such a case may be formed by any of the processes disclosed in reference to the metal film 224 of FIG. 2A. Any other configurations for the metal layer 604 on the first dielectric layer 602 are within the scope of the instant example. The metal layer 604 may include any of the metals disclosed in reference to the metal layer 104 of FIG. 1.

An etch stop layer 606 is formed on the metal layer 604 and on the first dielectric layer 602 directly adjacent to the metal layer 604. The etch stop layer 606 includes metal oxide, and is less than 10 nanometers thick. The etch stop layer may be formed by an ALD process, for example as disclosed in reference to FIG. 2C through FIG. 2E. A second dielectric layer 608 is formed over the etch stop layer 606. The second dielectric layer 608 may have a different composition from the composition of the first dielectric layer. For example, the second dielectric layer 608 may include primarily silicon nitride or silicon oxynitride. The second dielectric layer 608 may be at least 100 nanometers thick.

An etch mask 632 is formed over the second dielectric layer 608 which exposes a portion of an area for an etched region 610. The area for the etched region 610 extends over a portion of the metal layer 604 and over a portion of the first dielectric layer directly adjacent to the metal layer 604, for example, as indicated in FIG. 6A. The etch mask 632 may include photoresist, formed by a photolithographic process, accruing the advantage described in reference to the second etch mask 232 of FIG. 2F.

Figure 6B:
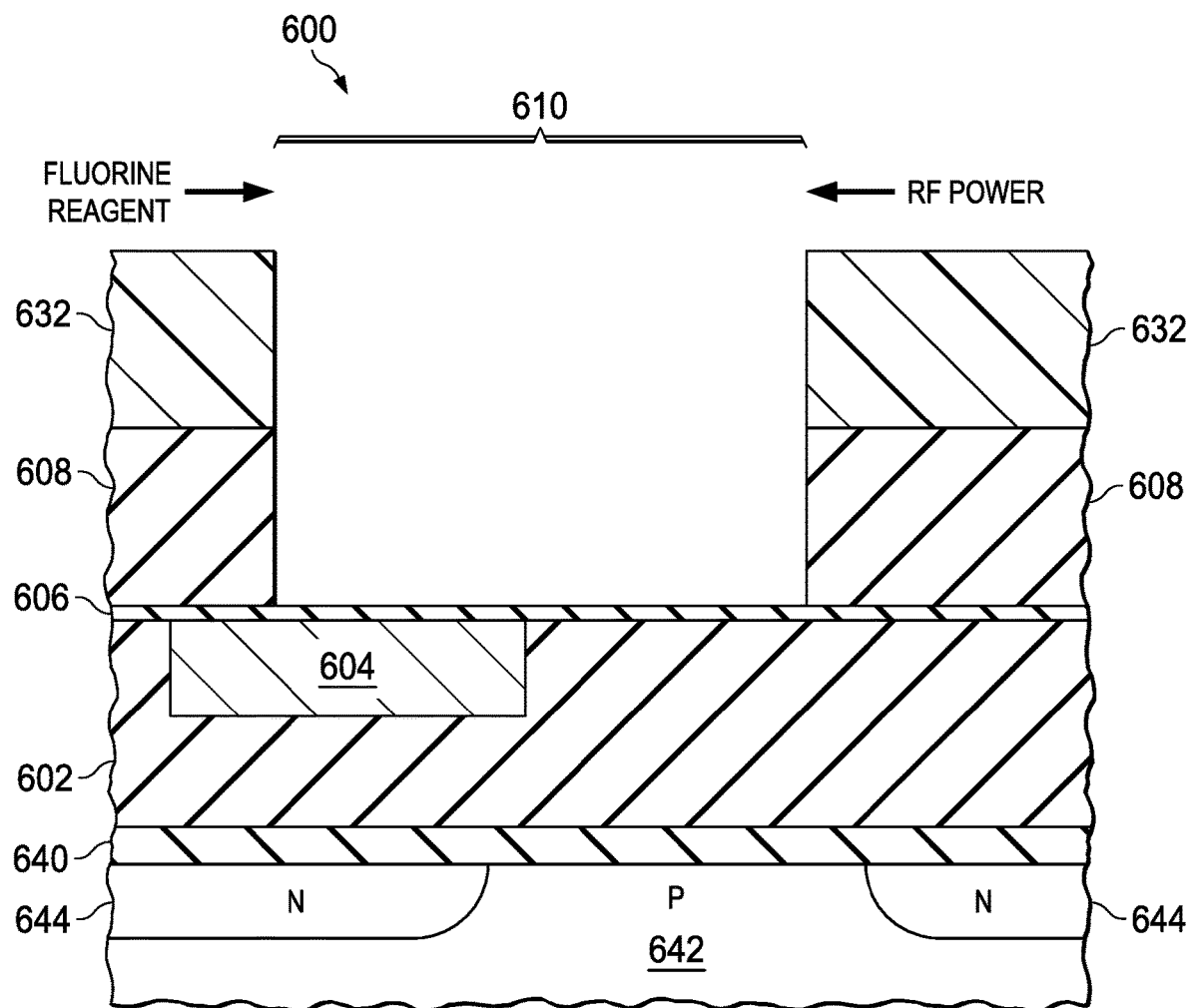

Referring to FIG. 6B, the second dielectric layer 608 is removed from a portion of the etched region 610 above the etch stop layer 606, by a plasma process using a fluorine-containing reagent, denoted in FIG. 6B as "FLUORINE REAGENT", and optionally a carrier gas. RF power is applied to the fluorine-containing reagent to form a plasma. The plasma process may be substantially free of the noble gases and oxygen, accruing the advantages discussed in reference to FIG. 2G and FIG. 2H.

Figure 6C:
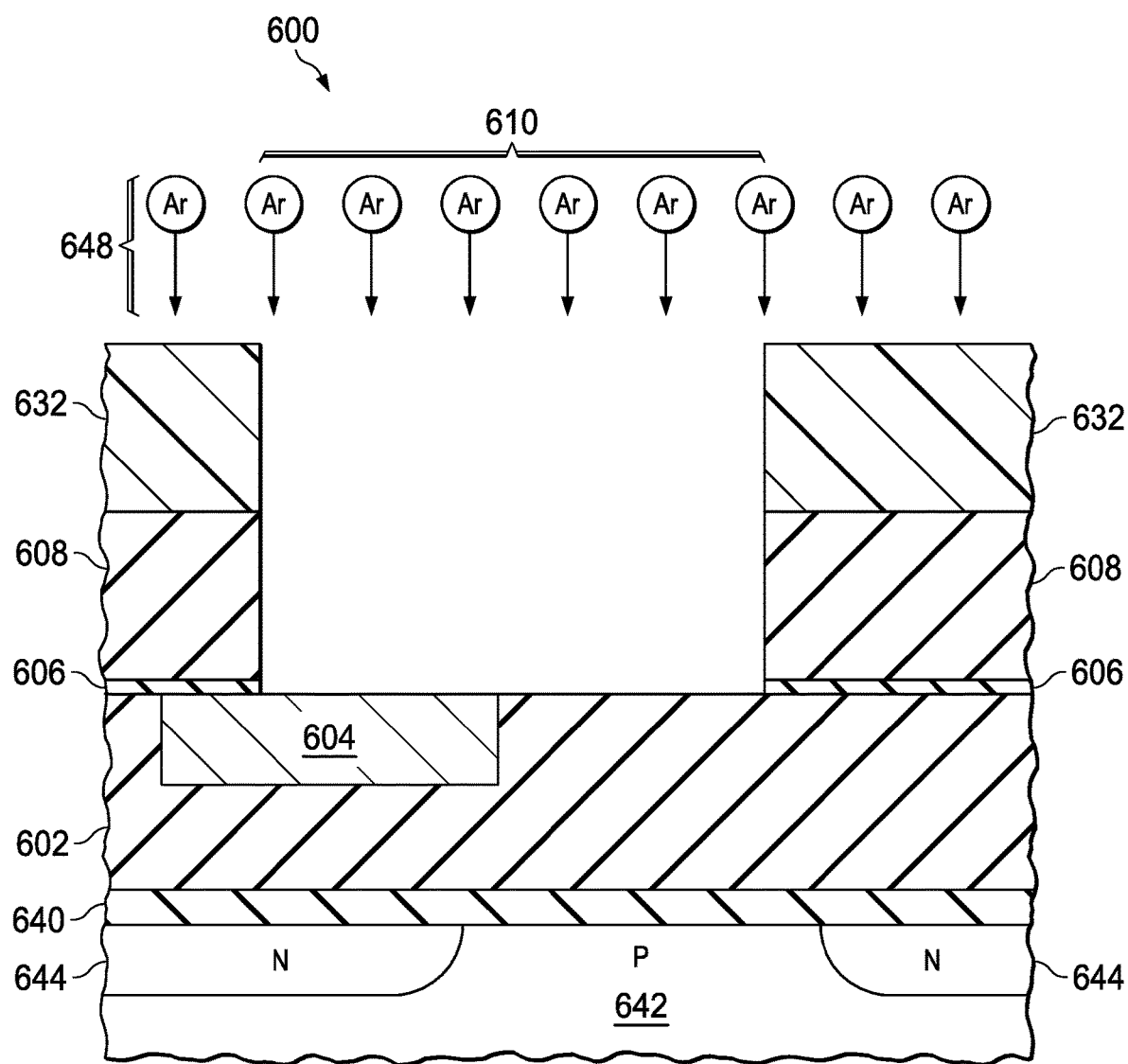

Referring to FIG. 6C, the etch stop layer 606 is removed where exposed in the etched region 610, without removing a significant amount of the metal layer 604. The etch stop layer 606 may be removed, for example, by an ion mill process using argon ions 648 in a timed process of a few seconds. The ion mill process is sometimes referred to as a sputter etch process. Alternatively, the etch stop layer 606 may be removed by a wet etch process using an aqueous solution of phosphoric acid, hydrofluoric acid, buffered hydrofluoric acid, ammonium hydroxide and hydrogen peroxide, or a mixture of acetic acid and ammonium fluoride. Other methods for removing the etch stop layer 606 without removing a significant amount of the metal layer 604, for example a short plasma etch using chlorine, are within the scope of the instant example.

Figure 6D:
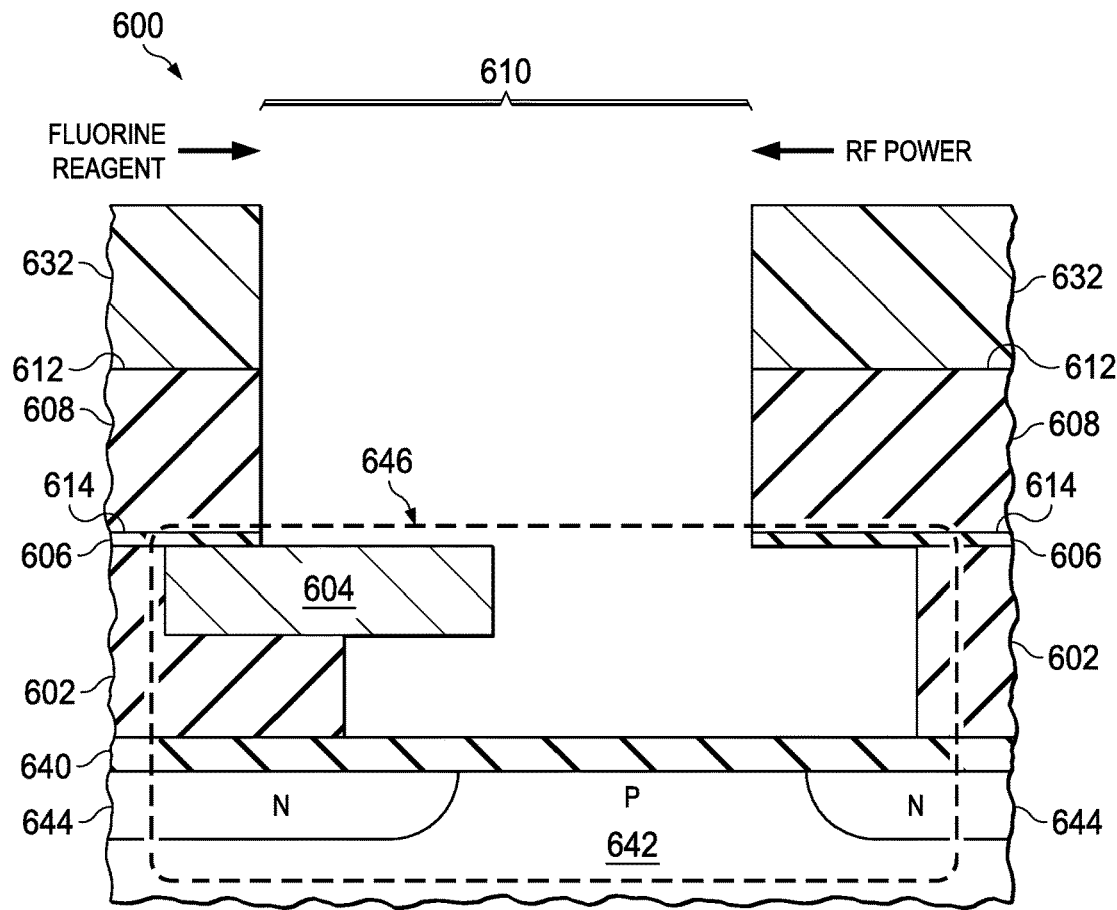

Referring to FIG. 6D, the first dielectric layer 602 is removed from a second portion of the etched region 610, exposing a portion of the third dielectric layer 640 over the semiconductor region 642 between the source and drain regions 644. The first dielectric layer 602 may be removed, for example, by a downstream etch process which uses a fluorine-containing reagent, denoted as "FLUORINE REAGENT" and RF power, denoted as "RF POWER" in FIG. 6D, and is free of oxygen, so as to reduce erosion of the etch mask 632. Alternatively, the first dielectric layer 602 may be removed by a wet etch process which is selective to the third dielectric layer 640, for example an aqueous solution of buffered hydrofluoric acid. The etched region 610 of the instant example extends upward from a top surface 614 of the etch stop layer 606 to a top surface 612 of the second dielectric layer 608, and laterally over a portion of the metal layer 604, and further extends below the etch stop layer 606 to the third dielectric layer 640.

The etch mask 632 is subsequently removed. The method of the instant example may provide an ISFET 646 or similar sensor for the microelectronic device 600.

Figure 7:
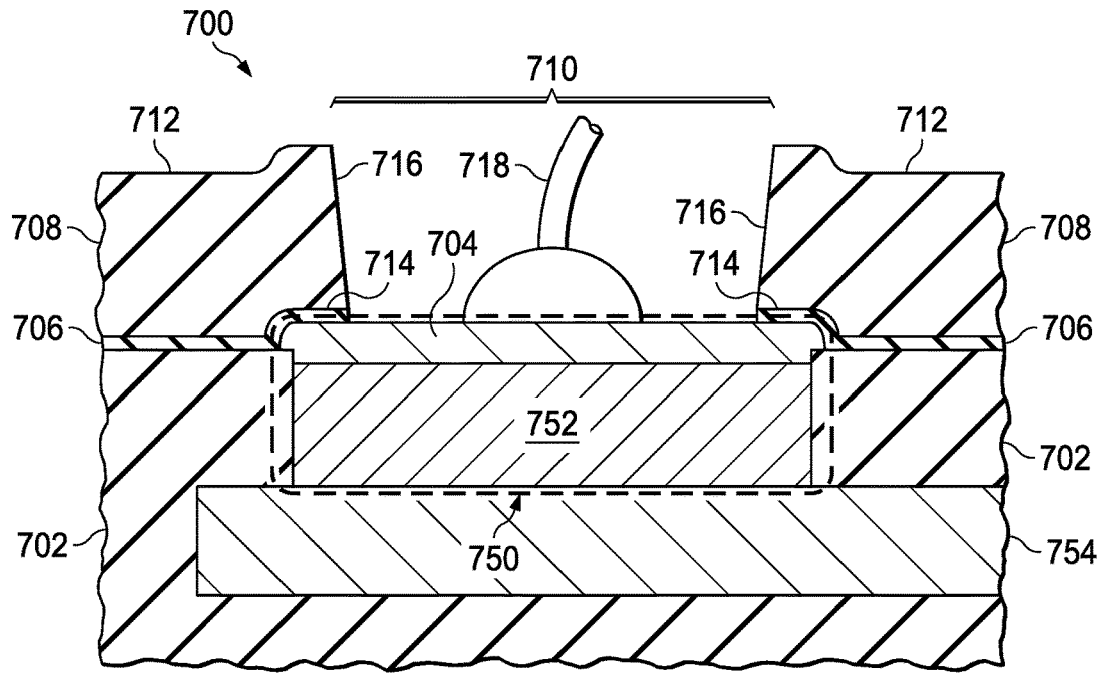
FIG. 7 is a cross section of another example microelectronic device including a metal layer.

FIG. 7 is a cross section of another example microelectronic device including a metal layer. The microelectronic device 700 includes a first dielectric layer 702. In the instant example, the first dielectric layer 702 may include silicon dioxide or silicon dioxide-based dielectric material. The first dielectric layer 702 may be part of an interconnect dielectric layer stack of the microelectronic device 700.

A metal layer 704 is located over the first dielectric layer 702. The metal layer 704 may be a top metal layer of a bond pad 750 of the microelectronic device 700, as depicted in FIG. 7. The bond pad 750 may optionally include a lower metal layer 752 under the metal layer 704. The lower metal layer 752 may include sub-layers of metal, such as an adhesion sub-layer, a barrier sub-layer, or a fill sub-layer. The metal layer 704 provides a bonding surface for the bond pad 750. The metal layer 704 may include, for example, gold, platinum, aluminum, or other metal appropriate for wire bonding.

The bond pad 750 may be electrically coupled to an interconnect 754 of the microelectronic device 700. The interconnect 754 may be located in the first dielectric layer 702. The interconnect 754 may include aluminum or copper, for example. The bond pad 750 may be directly on the interconnect 754, as depicted in FIG. 7, or may be electrically coupled to the interconnect 754 through vias or other conductive structures, not shown.

An etch stop layer 706 is disposed over a portion of the metal layer 704 and over the first dielectric layer 702 directly adjacent to the metal layer 704. The etch stop layer 706 is less than 10 nanometers thick. The etch stop layer 706 includes at least one metal oxide, for example, any of the metal oxides disclosed in reference to the etch stop layer 106 of FIG. 1. The etch stop layer 706 has a composition different from a composition of the first dielectric layer 702.

A second dielectric layer 708 is disposed over the etch stop layer 706. The second dielectric layer 708 of the instant example may be a protective overcoat (PO) layer of the microelectronic device 700, and so may include silicon dioxide, silicon nitride, silicon oxynitride, or any combination thereof, for example. The second dielectric layer 708 has a composition different from a composition of the etch stop layer 706. The second dielectric layer 708 has a thickness of at least 100 nanometers. The etch stop layer 706 may advantageously provide better adhesion to the metal layer 704 than would be provided by the second dielectric layer 708. In versions of the instant example in which the metal layer 704 includes primarily platinum or gold, and in which the second dielectric layer 708 includes include silicon dioxide, silicon nitride, or silicon oxynitride, the metal oxide in the etch stop layer 706 may provide superior adhesion to the metal layer 704 than would be provided by the second dielectric layer 708, which may advantageously improve reliability of the microelectronic device 700.

The microelectronic device 700 is free of the second dielectric layer 708 in an etched region 710. The etched region 710 extends upward from a top surface 712 of the second dielectric layer 708 to a top surface 714 of the etch stop layer 706, and extends laterally over at least a portion of the metal layer 704, to expose an area for a wire bond 718. The etched region 710 may optionally be free of the etch stop layer 706, as depicted in FIG. 7. Alternatively, a portion or all of the etch stop layer 706 may be present in the etched region 710, and the wire bond 718 may optionally be made through the etch stop layer 706 which may be present. An advantage of the metal oxide in the etch stop layer 706 is manifested by the fact that the etch stop layer 706 may be sufficiently thick to prevent etching of the first dielectric layer 702 during etching of the etched region 710, and may be sufficiently thin to enable formation the wire bond 718 through the etch stop layer 706. Lateral surfaces 716 of the second dielectric layer 708 facing the etched region 710 may be straight, which is not readily attained by a wet etch process, and is indicative of the etched region 710 being formed by a plasma process. The wire bond 718 makes contact with the metal layer 704 where exposed by the etched region 710, and provides an electrical connection to the interconnect 754 through the bond pad 750. The lateral surfaces 716 of the second dielectric layer 708 facing the etched region 710 may be free of metal residue from the metal layer 704 as a result of being formed with the etch stop layer 706, advantageously reducing potential contamination of the microelectronic device 700.

Figure 8A:
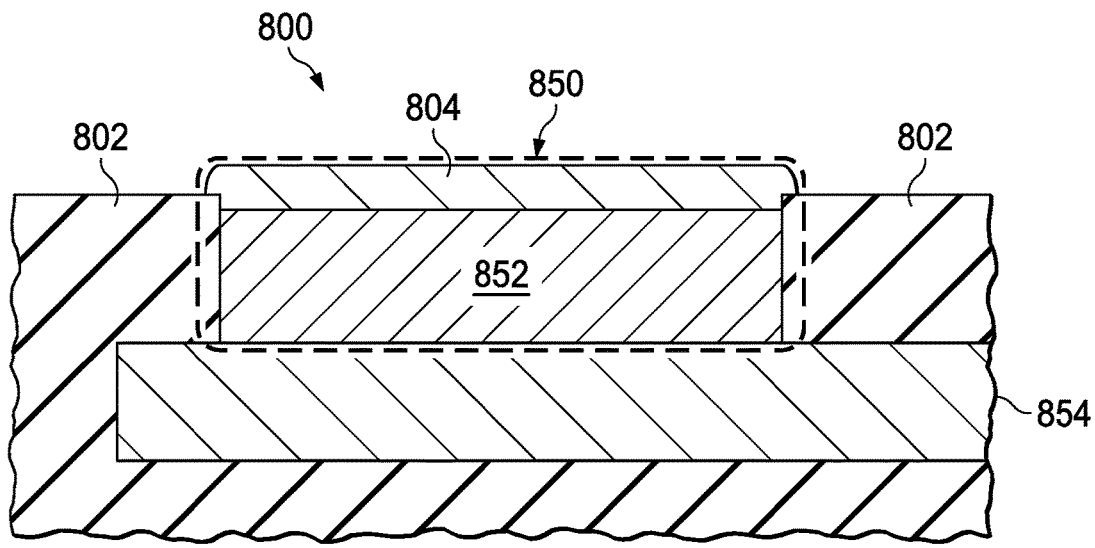
FIG. 8A through FIG. 8D are cross sections of a microelectronic device which includes a metal layer, depicted in stages of another example method of formation.

FIG. 8A through FIG. 8D are cross sections of a microelectronic device which includes a metal layer, depicted in stages of another example method of formation. Referring to FIG. 8A, the microelectronic device 800 includes a first dielectric layer 802, which may be part of an interconnect dielectric layer stack of the microelectronic device 800. The first dielectric layer 802 may include silicon dioxide or silicon dioxide-based dielectric material, for example. An interconnect 854 may be formed in or below the first dielectric layer 802. In one version of the instant example, the interconnect 854 may include aluminum and may be formed by etching an aluminum layer using an ME process. In another version, the interconnect 854 may include copper and be formed by a damascene process. Other compositions and methods of formation for the interconnect 854 are within the scope of the instant example.

A bond pad 850 is formed to make an electrical connection to the interconnect 854. The bond pad 850 includes a metal layer 804 extending to a top of the bond pad 850. In one version of the instant example, the bond pad 850 may be formed by etching a bond pad opening in the first dielectric layer 802 to expose a portion of the interconnect 854, followed by plating a lower metal layer 852, and subsequently plating the metal layer 804 on the lower metal layer 852. In another version, the bond pad 850 may be formed by etching a bond pad opening in the first dielectric layer 802 to expose a portion of the interconnect 854, followed by forming a metal layer including an adhesion metal sub-layer and an aluminum layer on the first dielectric layer 802, extending into the bond pad opening, and subsequently etching the metal layer outside of the bond pad opening, so that the aluminum layer provides the metal layer 804. Other methods of forming the bond pad 850 are within the scope of the instant example.

Figure 8B:
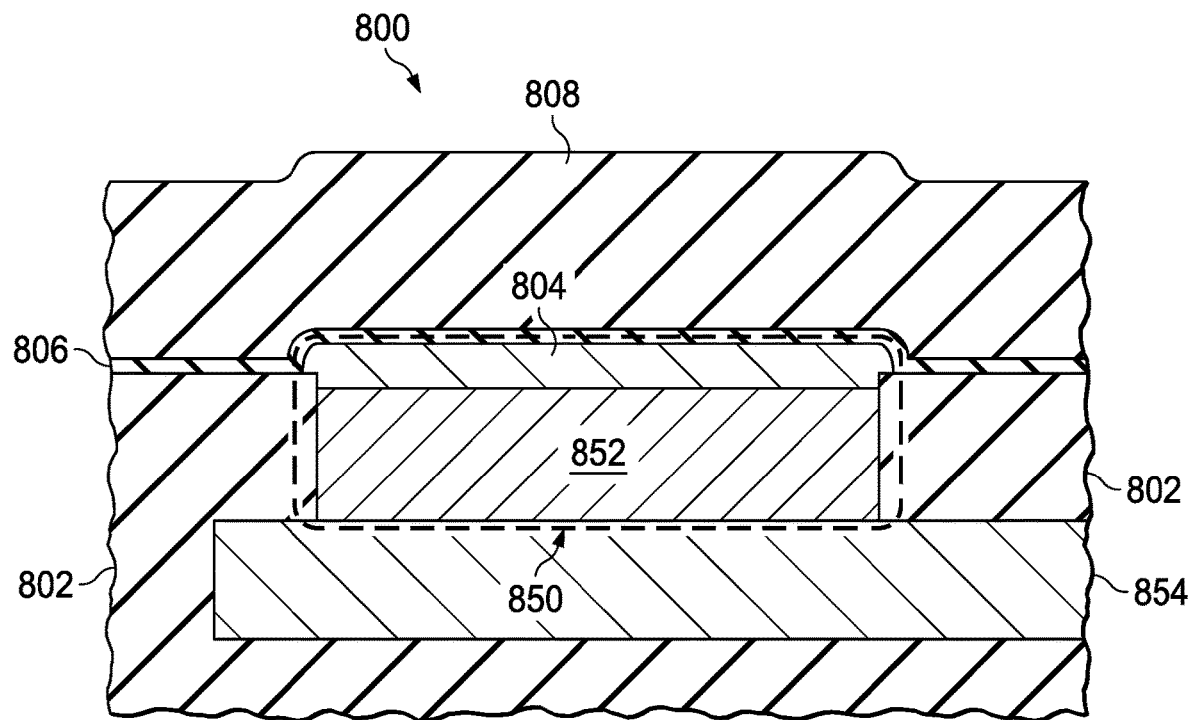

Referring to FIG. 8B, an etch stop layer 806 is formed on the metal layer 804 and on the first dielectric layer 802 directly adjacent to the metal layer 804. The etch stop layer 806 includes metal oxide, and is less than 10 nanometers thick. The etch stop layer may be formed by an ALD process, for example as disclosed in reference to FIG. 2C through FIG. 2E. A second dielectric layer 808 is formed over the etch stop layer 806. The second dielectric layer 808 may include any of the dielectric materials disclosed in reference to the second dielectric layer 708 of FIG. 7. The second dielectric layer 808 may be formed by any of the processes disclosed in reference to the second dielectric layer 208 of FIG. 2F. The second dielectric layer 808 may be at least 100 nanometers thick. The etch stop layer 806 may advantageously provide better adhesion to the metal layer 804 than would be provided by the second dielectric layer 808, especially when the metal layer 804 includes primarily platinum or gold, advantageously providing improved reliability as disclosed in reference to FIG. 7.

Figure 8C:
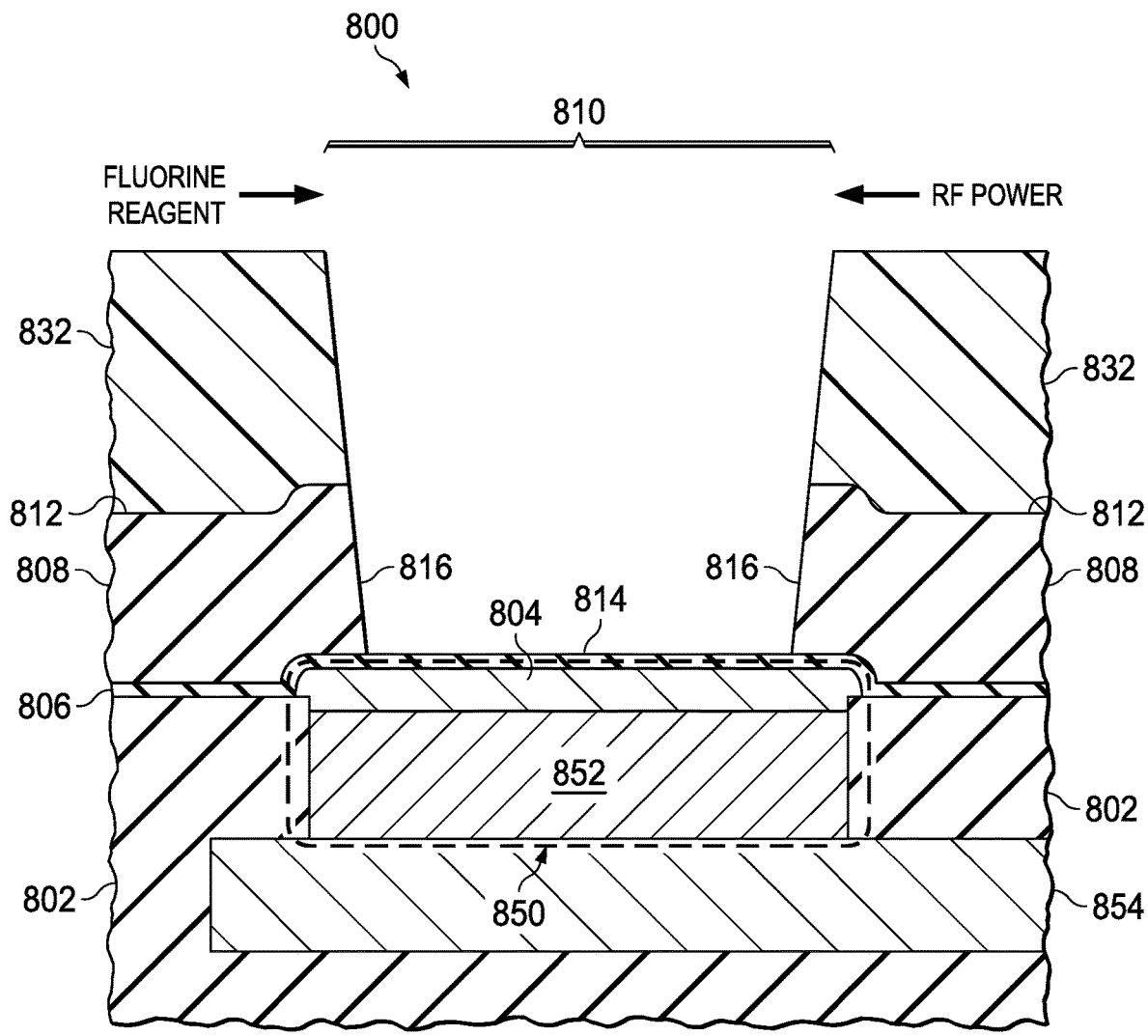

Referring to FIG. 8C, an etch mask 832 is formed over the second dielectric layer 808 which exposes an area for an etched region 810. The area for the etched region 810 extends over at least a portion of the metal layer 804. The etch mask 832 may include photoresist, formed by a photolithographic process, accruing the advantage described in reference to the second etch mask 232 of FIG. 2F.

Subsequently, the second dielectric layer 808 is removed from the etched region 810, stopping on the etch stop layer 806, by a plasma process using a fluorine-containing reagent, denoted in FIG. 8C as "FLUORINE REAGENT". A carrier gas may also be used in the plasma process. RF power, denoted in FIG. 8C as "RF POWER", is applied to the fluorine-containing reagent to form a plasma. The plasma process may be substantially free of the noble gases and oxygen, accruing the advantages discussed in reference to FIG. 2G and FIG. 2H. The plasma process may produce substantially straight profiles of lateral surfaces 816 of the second dielectric layer 808. The etched region 810 extends upward from a top surface 814 of the etch stop layer 806 to a top surface 812 of the second dielectric layer 808. The plasma process may be continued after the etch stop layer 806 in an overetch step, to advantageously provide complete removal of the second dielectric layer 808 in the etched region 810. The metal oxide in the etch stop layer 806 advantageously prevents removal of dielectric material from the first dielectric layer 802 during the overetch step.

The etch mask 832 is subsequently removed. The etch mask 832 may be removed, for example, by a plasma process using oxygen, a wet clean process, or a combination thereof.

Figure 8D:
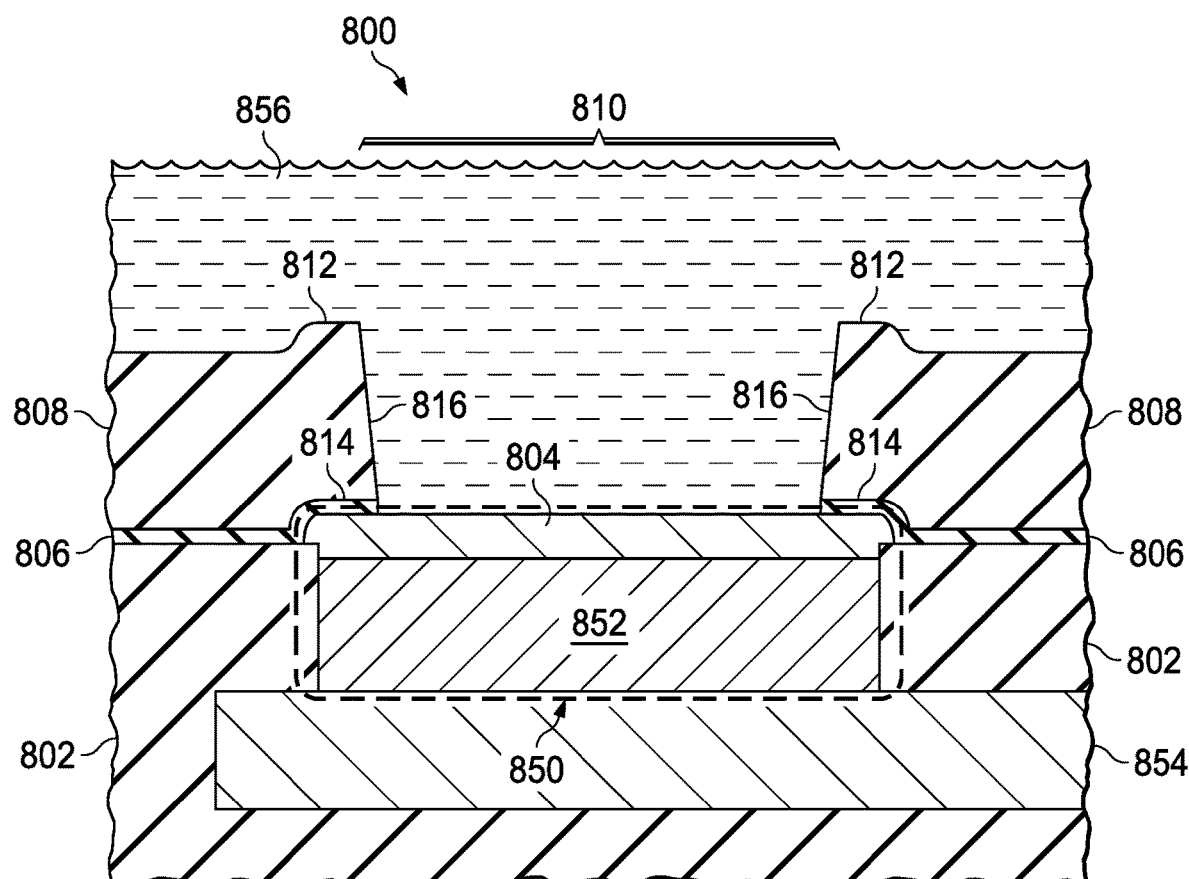

Referring to FIG. 8D, the etch stop layer 806 may optionally be removed where exposed by the second dielectric layer 808. The etch stop layer 806 may be removed to facilitate a subsequent wire bonding operation. The etch stop layer 806 may be removed by a wet etch solution 856, as depicted in FIG. 8D. The wet etch solution 856 may include, for example, an aqueous solution of phosphoric acid, hydrofluoric acid, buffered hydrofluoric acid, ammonium hydroxide and hydrogen peroxide, or a mixture of acetic acid and ammonium fluoride. Other formulations of the wet etch solution 856 are within the scope of the instant example. The wet etch solution 856 may be formulated to remove very little or substantially none of the first dielectric layer 802 or the second dielectric layer 808. In another version of the instant example, the etch stop layer 806 may be removed by a dry process, for example a sputter etch process as disclosed in reference to FIG. 6C. Alternatively, the etch stop layer 806 may be left in place, advantageously reducing fabrication cost and complexity of the microelectronic device 800.

Formation of the microelectronic device 800 may be continued with formation of a wire bond, not shown, on the metal layer 804. Forming the microelectronic device 800 by the method of the instant example may provide a cleaner surface on the metal layer 804 for wire bonding than other methods which do not have the etch stop layer 806. In a version of the instant example in which the etch stop layer 806 is not removed where exposed by the second dielectric layer 808, the wire bond may be made through the etch stop layer 806 to the metal layer 804. The metal oxide in the etch stop layer 806 may advantageously provide effective protection of the first dielectric layer 802, and may also enable forming the wire bond through the etch stop layer 806.

Various features of the examples disclosed herein may be combined in other manifestations of example integrated circuits. For example, a microelectronic device may have a metal layer as disclosed with respect to any of the structures of FIG. 1, FIG. 3, FIG. 5, or FIG. 7, on a first dielectric layer as disclosed with respect to any of the structures of FIG. 1, FIG. 3, FIG. 5, or FIG. 7, and an etch stop layer as disclosed with respect to any of the structures of FIG. 1, FIG. 3, FIG. 5, or FIG. 7. Similarly, a microelectronic device may be formed by forming a metal layer as disclosed in reference to FIG. 2A and FIG. 2B, as disclosed in reference to FIG. 4A, as disclosed in reference to FIG. 6A, or as disclosed in reference to FIG. 8A, combined with forming an etch stop layer as disclosed in reference to FIG. 2C through FIG. 2E, and leaving the etch stop layer in an etched region, as disclosed in reference to FIG. 2H or FIG. 4E, or removing the etch stop layer as disclosed in reference to FIG. 6C or FIG. 8D, and further combined with forming an etched region as disclosed in reference to FIG. 2F through FIG. 2H, as disclosed in reference to FIG. 4C and FIG. 4D, as disclosed in reference to FIG. 6A through FIG. 6D, or as disclosed in reference to FIG. 8C.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic device, comprising:
   a first dielectric layer;
   a metal layer over the first dielectric layer;
   an etch stop layer on the first dielectric layer, the etch stop layer including a metal oxide, the etch stop layer being less than 10 nanometers thick and directly contacting the metal layer; and
   a second dielectric layer on the etch stop layer, wherein an etched region extends upward from a top surface of the etch stop layer to a top surface of the second dielectric layer, and extends laterally at least partially over the metal layer, the etched region being free of the second dielectric layer.

2. The microelectronic device of claim 1, wherein the etched region is free of the etch stop layer.

3. The microelectronic device of claim 1, wherein the metal layer comprises platinum and the metal oxide is aluminum oxide.

4. The microelectronic device of claim 1, wherein the metal layer includes a metal selected from the group consisting of platinum, gold, iridium, silver, palladium, rhodium, ruthenium, rhenium nickel, aluminum, and copper.

5. The microelectronic device of claim 1, wherein the metal oxide is selected from the group consisting of aluminum oxide, titanium oxide, zirconium oxide, hafnium oxide, vanadium oxide and tantalum oxide.

6. A microelectronic device, comprising: a first dielectric layer;
   a metal layer over the first dielectric layer;
   an etch stop layer on the first dielectric layer, the etch stop layer including a metal oxide, the etch stop layer being less than 10 nanometers thick; and
   a second dielectric layer on the etch stop layer, wherein an etched region extends upward from a top surface of the etch stop layer to a top surface of the second dielectric layer, and extends laterally at least partially over the metal layer, the etched region being free of the second dielectric layer, wherein the etched region extends past the metal layer on all sides of the metal layer.

7. The microelectronic device of claim 1, wherein the etched region extends below the etch stop layer, and wherein the etched region is free of the first dielectric layer.

8. The microelectronic device of claim 1, further comprising an electrical connection to the metal layer, the electrical connection being located in the first dielectric layer.

9. A microelectronic device, comprising:
   a first dielectric layer;
   a metal layer over the first dielectric layer;
   an etch stop layer on the first dielectric layer, the etch stop layer including a metal oxide, the etch stop layer being less than 10 nanometers thick and directly contacting the metal layer;
   a second dielectric layer on the etch stop layer, wherein an etched region extends upward from a top surface of the etch stop layer to a top surface of the second dielectric layer, and extends laterally at least partially over the metal layer, the etched region being free of the second dielectric layer; and
   an electrical connection to the metal layer, the electrical connection including a wire bond to the metal layer through the etch stop layer, wherein the wire bond contacts the etch stop layer.

10. The microelectronic device of claim 1, wherein the etched region has a width less than a thickness of the second dielectric layer.

11. The microelectronic device of claim 1, wherein lateral surfaces of the second dielectric layer facing the etched region are straight.

12. The microelectronic device of claim 1, wherein the metal layer is disposed in a trench in the first dielectric layer.

13. The microelectronic device of claim 1, wherein the first dielectric layer includes a dielectric material selected from the group consisting of silicon dioxide, silicon nitride, and silicon oxynitride, and the second dielectric layer includes a dielectric material selected from the group consisting of silicon dioxide, silicon nitride, and silicon oxynitride.

14. A microelectronic device, comprising:
a dielectric layer;
a bond pad over the dielectric layer, the bond pad comprising a platinum comprising surface layer;
an etch stop layer on the dielectric layer and the bond pad, the etch stop layer comprising aluminum oxide, the etch stop layer being less than 10 nanometers thick;
a protective overcoat on the etch stop layer, wherein the protective overcoat layer includes an opening over the bond pad; and
a wire bond extending through the etch stop layer to the bond pad, the wire bond physically contacting the etch stop layer.

15. The microelectronic device of claim 14, wherein the metal layer is disposed in a trench in the first dielectric layer.

16. A microelectronic device, comprising:
a first dielectric layer;
a metal layer containing platinum over the first dielectric layer;
an aluminum oxide layer directly on the metal layer, the aluminum oxide layer being less than 10 nanometers thick;
a second dielectric layer on the aluminum oxide layer; and
a cavity in the first dielectric layer and the second dielectric layer, the cavity extending from a surface of the metal layer to a surface of the second dielectric layer, and extending laterally at least partially over the metal layer, the cavity extending below the aluminum oxide layer into the first dielectric layer.

17. The microelectronic device of claim 16, wherein the metal layer is disposed in a trench in the first dielectric layer.

18. The microelectronic device of claim 16, further comprising an electrical connection to the metal layer, the electrical connection being located in the first dielectric layer.

19. The microelectronic device of claim 9, wherein the metal layer includes a metal selected from the group consisting of platinum, gold, iridium, silver, palladium, rhodium, ruthenium, rhenium nickel, aluminum, and copper.

20. The microelectronic device of claim 9, wherein the metal oxide is selected from the group consisting of aluminum oxide, titanium oxide, zirconium oxide, hafnium oxide, vanadium oxide and tantalum oxide.

* * * * *